United States Patent [19]
Kazama et al.

[11] Patent Number: 5,744,511
[45] Date of Patent: Apr. 28, 1998

[54] VISIBLE RAY POLYMERIZATION INITIATOR AND VISIBLE RAY POLYMERIZABLE COMPOSITION

[75] Inventors: Hideki Kazama; Takeshi Satoh; Makoto Oguri, all of Tokuyama, Japan

[73] Assignee: Tokuyama Corporation, Yamaguchi-ken, Japan

[21] Appl. No.: 634,259

[22] Filed: Apr. 18, 1996

[30] Foreign Application Priority Data

Apr. 19, 1995 [JP] Japan .................. 7-093924

[51] Int. Cl.$^6$ .................. C09J 4/02; C08F 2/50; C08K 3/20; C08K 3/36
[52] U.S. Cl. .................. 522/25; 522/26; 522/81; 522/83; 522/182; 522/28; 522/29; 522/908
[58] Field of Search .................. 522/7, 25, 26, 522/28, 29, 68, 182, 81, 83, 908

[56] References Cited

U.S. PATENT DOCUMENTS

| | | | |
|---|---|---|---|
| 4,950,581 | 8/1990 | Koike et al. .................. | 522/25 |
| 5,500,453 | 3/1996 | Toba et al. .................. | 522/25 |

FOREIGN PATENT DOCUMENTS

| | | |
|---|---|---|
| 0562897 | 9/1993 | European Pat. Off. . |
| 0672953 | 9/1995 | European Pat. Off. . |

OTHER PUBLICATIONS

Derwent Publications Ltd., London, GB; AN 90–228787 and JP 02 157 760 A (TOYOBO KK), 18 Jun. 1990.

*Primary Examiner*—Susan W. Berman
*Attorney, Agent, or Firm*—Sherman and Shalloway

[57] ABSTRACT

A visible-ray polymerizable composition comprising:
(1) a monomer comprising a (meth)acrylate monomer; and
(2) a visible-ray polymerization initiator comprising:
  (A) a coumarin dye;
  (B) at least one photo acid generator selected from the group consisting of a halo-alkyl substituted s-triazine derivative and a diphenyliodonium salt compound; and
  (C) an aryl borate compound.

14 Claims, No Drawings

5,744,511

VISIBLE RAY POLYMERIZATION INITIATOR AND VISIBLE RAY POLYMERIZABLE COMPOSITION

BACKGROUND OF THE INVENTION

1. Field of the Invention

The present invention relates to a novel visible-ray polymerization initiator that is useful for the photo-resist materials, form plates for printing, holographic materials and, particularly, for dental materials.

2. Description of the Prior Art

A variety of photo-polymerization initiators have heretofore been proposed which are capable of generating radicals or ions upon irradiation with visible rays and are capable of polymerizing polymerizable unsaturated compounds or cyclic compounds.

Study has been forwarded extensively concerning a compound which undergoes decomposition upon absorbing visible rays to form a polymerizable active species, and a dye sensitization polymerization comprising a combination of a radical-generating source or an acid-generating source that does not absorb visible rays and a dye that absorbs visible rays, and such compounds have been used in practice. The former example can be represented by an acylphosphine oxide and an α-diketone compound, and the latter example can be represented by a visible-ray radical polymerization initiator composition comprising a squarylium sensitizer dye and an imidazole derivative disclosed in Japanese Laid-Open Patent Publication No. 27436/1993, a visible-ray radical polymerization initiator composition comprising a combination of a squarylium dye and a halo-methyl substituted -s-triazine derivative disclosed in Japanese Laid-Open Patent Publication No. 5002/1993, and a visible-ray radical polymerization initiator composition comprising a combination of a benzophenone group-containing peroxy ester and a pyrylium dye disclosed in Japanese Laid-Open Patent Publication No. 76503/1985. However, these compositions still exhibit low sensitivity to the visible rays, and it has been desired to provide compounds that exhibit higher sensitivities.

Japanese Laid-Open Patent Publication No. 143044/1987 and Japanese Laid-Open Patent Publication No. 111402/1989 disclose polymerization methods using a dye-borate complex as an initiator involving, however, a problem of low sensitivity. Japanese Laid-Open Patent Publication 329712/1994 discloses a polymerization initiator comprising a combination of a borate compound and an acidic compound that contains a photo acid generator. However, this polymerization initiator does not absorb visible rays, and no polymerization takes place upon irradiation with visible rays. Besides, the polymerization does not at all take place depending upon the photo acid generator that is selected.

Even in the field of dental materials, in recent years, polymerization relying upon the visible rays has been extensively used to substitute for ultraviolet rays from the standpoint of safety and operability. As the visible-ray polymerization initiator, there have usually been used aromatic ketones or α-diketones represented by camphorquinone and amines in combination leaving, however, a problem with regard to adhesiveness to the tooth substrate.

SUMMARY OF THE INVENTION

The object of the present invention is to provide a visible-ray polymerization initiator having sufficient degree of sensitivity for visible-rays, exhibiting excellent adhesiveness, particularly, to the tooth substrate, and featuring high safety.

Another object of the present invention is to provide an adhered structure by adhering a composite resin to the tooth substrate via an adhesive layer, featuring a sufficiently large hardness and adhesion strength.

The present inventors have forwarded keen study in an attempt to accomplish the above-mentioned objects, have discovered the fact that a composition comprising a particular sensitizing dye, a particular photo acid generator and an aryl borate, is useful as a novel visible-ray polymerization initiator for accomplishing the above-mentioned objects, and have thus arrived at the present invention.

That is, the present invention is concerned with a visible-ray polymerization initiator comprising:

(A) a coumarin dye;

(B) at least one photo acid generator selected from the group consisting of a halo-alkyl substituted -s-triazine derivative and a diphenyliodonium salt compound; and (C) an aryl borate compound.

The visible-ray polymerization initiator of the present invention is very highly sensitive to visible rays, and a visible-ray polymerizable composition which contains the above polymerization initiator can be used particularly favorably as an adhesive polymerizable composition for dental applications and exhibits excellent adhesiveness to the tooth substrate.

When the adhesive polymerizable composition is used as an adhesive for adhering a dental filling material called composite resin to the tooth substrate, adhesion strength must be large enough to overcome the internal stress that builds up upon the curing of the composite resin, i.e., to overcome the tensile stress that builds up on the interface between the composite resin and the tooth substrate. Otherwise, the composite resin may split off after extended periods of use under severe oral environmental conditions. Besides, a gap forms in the interface between the composite resin and the tooth substrate, and bacteria infiltrate therethrough to adversely affect the dental pulp.

When the polymerizable composition containing a novel visible-ray polymerization initiator of the present invention is used as an adhesive, adhesion of the composite resin to the tooth substrate is strikingly improved compared with the visible-ray polymerization initiators that are usually used. Therefore, a sufficiently large adhesion strength is obtained with respect to the tooth substrate, e.g., to the dentin even without using a pre-treating agent for the teeth that has heretofore been used in the field of adhesive material for the dental use.

Adhesion force to the tooth substrate is impaired by, for example, oxygen, acid and water present in the interface. By using the visible-ray polymerization initiator of the present invention, however, it is considered that a trivalent boron compound is formed at the time of starting the polymerization and is decomposed by oxygen on the interface of the tooth substrate to form polymerizable radicals. It is therefore presumed that the polymerization proceeds on the interface making it possible to obtain a large adhesion strength.

DETAILED DESCRIPTION OF THE PREFERRED EMBODIMENT

[Dye Material (A)]

A typical example of the dye (A) of the present invention is a coumarin dye which is represented by the following formula (1).

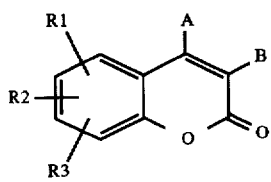
(1)

wherein R1, R2, and R3 are each independently selected from a hydrogen atom, a halogen atom, an alkyl group, an alkoxy group, a substituted or unsubstituted amino group, a substituted or unsubstituted alkylamino group, and a substituted or unsubstituted alkenylamino group, and herein at least two of the three groups R1, R2 and R3 may be bonded together to form a fused ring, A is a hydrogen atom, a cyano group or a substituted or unsubstituted alkyl group, and B is a hydrogen atom, a heterocyclic group having 5 to 9 carbon atoms, a substituted or unsubstituted aryl group, or a group represented by the following formula

wherein Z is a substituted or unsubstituted alkyl group, a substituted or unsubstituted aryl group, a substituted or unsubstituted alkenyl group, or a substituted or unsubstituted 3'-coumarino group.

Concrete examples of the coumarin dye that can be favorably used include 3-thienoylcoumarin, 3-(4-methoxy benzoyl)coumarin, 3-benzoylcoumarin, 3-(4-cyanobenzoyl) coumarin, 3-thienoyl-7-methoxycoumarin, 7-methoxy-3-(4-methoxybenzoyl)coumarin, 3-benzoyl-7-methoxycoumarin, 3-(4-cyanobenzoyl)-7-methoxycoumarin, 5,7-dimethoxy-3-(4-methoxybenzoyl)coumarin, 3-benzoyl-5,7-dimethoxycoumarin, 3-(4-cyanobenzoyl)-5,7-dimethoxycoumarin, 3-acetyl-7-dimethylaminocoumarin, 7-diethylamino-3-thienoylcoumarin, 7-diethylamino-3-(4-methoxybenzoyl)coumarin, 3-benzoyl-7-diethylaminocoumarin, 7-diethylamino-3-(4-cyanobenzoyl) coumarin, 7-diethylamino-3-(4-dimethylaminobenzoyl) coumarin, 3-cinnamoyl-7-diethylaminocoumarin, 3-(p-diethylaminocinnamoyl)-7-diethylaminocoumarin, 3-acetyl-7-diethylaminocoumarin, 3-carboxy-7-diethylaminocoumarin, 3-(4-carboxybenzoyl)-7-diethylaminocoumarin, 3,3'-carbonylbiscoumarin, 3,3'-carbonylbis (7-diethylamino)coumarin, 2,3,6,7-tetrahydro-1,1,7,7-tetramethyl-10-(benzothiazoyl)-11-oxo-1H,5H, 11H,-[1]benzopyrano[6,7,8-ij]quinolizine, 3,3'-carbonylbis (5,7-)dimethoxy-3,3'-biscoumarin, 3-(2'-benzimidazoyl)-7-diethylaminocoumarin, 3-(2'-benzoxazoyl)-7-diethylaminocoumarin, 3-(5'-phenylthiadiazoyl-2')-7-diethylaminocoumarin, 3-(2'-benzothiazoyl)-7-diethylaminocoumarin, 3,3'-carbonylbis (4-cyano-7-diethylamino)coumarin, 4-fluoromethyl-7-aminocoumarin, 4-trifluoroethyl-7-diethylaminocoumarin, 3-phenyl-7-aminocoumarin, 3-phenyl-7-(2H-naphtho[1,2d]triazol-2'yl) coumarin, 3-ethoxycarbonyl-5,6-benzocoumarin, 4-trifluoromethylpiperidino[3, 2-g]coumarin, 2,3,6,7-tetrahydro-11-oxo-1H,5H,11H,-[1]benzopyrano[6,7,8-ij] quinolozine-11-on, 3-(2'-benzothiazoyl)-4-cyano-7-diethylaminocoumarin, and the like. Among them, particularly preferred coumarin dyes are those in which a dialkylamino group or an alicyclic amino group is substituted for a benzene ring in the coumarin compound, and a heterocyclic or ketocoumarino group is substituted for the third position, and exhibit particularly high sensitivity to visible rays of from 400 to 500 nm used in dental applications.

According to the present invention, in addition to the above-mentioned coumarin dye, there can be used a photosensitizing dye having a maximum absorption wavelength of from 350 to 800 nm in one kind or being combined with coumarin dye. Examples of the photo-sensitizing dye that can be favorably used include cyanine dye, merocyanine dye, thiazine dye, azine dye, acridine dye, xanthene dye, squarylium dye, pyrylium salt dye, and the like dye.

Other examples of the photo-sensitizing dye that can be favorably used in the present invention include as follows.

cyanine dye:
monomethine cyanine dyes such as 3,3'-diethyl-2,2'-thiacyanine iodide, 1,3,3,1',3',3'-hexamethyl-2,2'-indocyanine perchlorate, 1,3'-diethyl-2,2'-quinothiacyanine iodide, 1,3'-diethyl-2,2'-quinoselenacyanine iodide, 1,1'-diethyl-2,2'-quinocyanine iodide, 1,1'-diethyl-2,4'-quinocyanine iodide, 1,1'-diethyl-4,4'-quinocyanine iodide, and the like.

trimethine cyanine dye such as 3,3'-diethyl-2,2'-thiazolinocarbocyanine iodide, 3,3'-diethyl-2,2'-oxacarbocyanine iodide, 3,3',9-triethyl-5,5'-diphenyl-2, 2'-oxacarbocyanine iodide, 1,3,3,1',3',3'-hexamethyl-2, 2'-thiacarbocyanine iodide, 3,3'-diethyl-2,2'-thiacarbocyanine iodide, 3,3',9-triethyl-2,2'-(6,7,6',7'-dibenzo)thiacarbocyanine iodide, 1,1'-diethyl-2,4'-quinocarbocyanine iodide, and the like.

pentamethine cyanine dyes such as 3,3'-diethyl-2,2'-oxadicarbocyanine iodide, 3,3'-diethyl-9,11-neopentylene-2,2'-thiadicarboxyanine iodide, 3,3'-diethyl-2,2'-(4,5,4',5'-dibenzo)thiadicarboxyanine iodide and the like.

heptamethine cyanine dyes such as 3,3'-diethyl-2,2'-oxatricarbocyanine iodide, 3,3'-diethyl-2,2'-thiatricarboxyanine bromide, and the like.

merocyanine dye:
3-ethyl-5-[2-(3-methyl-2-thiazolidinylidene)ethylidene]-2-thio-2,4-oxazolidinedinone, 1,3-diethyl-5-[2-(3-ethyl-2-benzothiazolinylidene)-ethylidene]-2-thiohydantoin, 3-carboxymethyl-5-[2-(3-ethyl-2-benzothiazolinylidene)ethylidene]rhodanine, 3-ethyl-5-[2-(3-ethyl-2-benzothiazolinylidene)-ethylidene] rhodanine, 3-ethyl-5-[2-(3-ethyl-4-methyl-2-thiazolinylidene)ethylidene] rhodanine, and the like.

thiazine dye or azine dye:
azine dye such as methylene blue and thionine chloride, and azine dye such as riboflavin, 1-amino-4-nitrophenazine, and the like.

acridine dye:
1-aminoacridine, 9-(2'-hydroxystyryl)acridine, acridine orange, acridine yellow, and the like.

xanthene dye:
Rhodamine, Fluoresceine, Rose Bengale, and the like.

squarylium dye:
internal salt of dihydro-3-[2-hydroxy-3-(5-isopropyl-3,8-dimethyl-1-azylenyl)-4-oxo-2-cyclobutene-1-ylidene]-7-isopropyl-1,4 -dimethylazulenirium hydroxide, internal salt of {4-[3-[4-(N-ethyl-N-octadecylamino)-2-hydroxyphenyl]-2-hydroxy-4-oxo-2-cyclobutene-1-ylidene]-3-hydroxy-2,5-cyclohexadiene-1-ylidene}-N-ethyl-N-octadecylammonium hydroxide, and the like.

pyrylium dye:
triphenylpyrilium perchlorate, 2,6-diphenyl-4-(4-methylphenyl)thiopyrylium perchlorate, 2,6-bis(4- methylphenyl)-4-(4-phenyl)thiopyrylium perchlorate, 2,4,6-triphenylthiopyrylium perchlorate, and the like.

The photo-sensitizing dye (A) may be used being suitably selected depending upon the wavelength and intensity of light used for the polymerization or upon the kind and amount of the photo acid generator of the component (B), and can be used in a single kind or being mixed in two or more kinds. The amount of addition may differ depending upon other components that are used in combination or the kind of the polymerizable monomer. Usually, however, the photosensitizing dye is added to the visible-ray polymerization initiator in an amount of from 0.00001 to 50% by weight and, preferably, from 0.00005 to 30% by weight. When the amount of addition is smaller than 0.00001% by weight, the sensitivity to the visible rays decreases drastically, which is not desirable. When the amount of addition is larger than 50% by weight, on the other hand, the cured product is colored, and light is all absorbed by the surface; i.e., curing is not deeply effected.

[Photo Acid Generator (B)]

The photo acid generator (B) used for the visible-ray polymerization initiator of the present invention forms a BrØnsted acid or a Lewis acid upon irradiation with light.

A typical example of the photo acid generator (B) of the present invention is a halo-alkyl substituted -s-triazine derivative represented by the following formula (2),

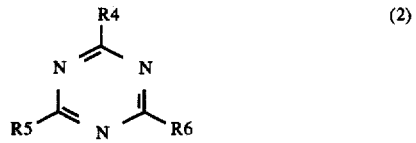

(2)

wherein R4, R5 and R6 are each independently selected from a substituted or unsubstituted alkyl group, a substituted or unsubstituted aryl group, a substituted or unsubstituted alkenyl group, and a substituted or unsubstituted alkoxy group provided that at least one of R4, R5 and R6 is a halo-alkyl group.

Another typical example of the photo acid generator (B) of the present invention is a diphenyliodonium salt compound represented by the following formula (3),

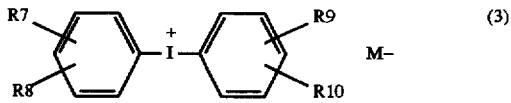

(3)

wherein R7, R8, R9 and R10 are each independently a hydrogen atom, a halogen atom, an alkyl group, an aryl group, an aralkyl group, an alkenyl group and an alkoxy group, and M− is a hydrohalogenic acid ion or a Lewis acid ion.

The halogen atom of the halo-alkyl group in the above-mentioned general formula (2) will preferably be chlorine, bromine or iodine. Usually, however, use is made of a compound having a trichloromethyl group for which three chlorine atoms are substituted.

Concrete examples of the halo-alkyl substituted -s-triazine derivative include 2,4,6-tris (trichloromethyl)-s-triazine, 2,4,6-tris (tribromomethyl)-s-triazine, 2-methyl-4, 6-bis (trichloromethyl)-s-triazine, 2-methyl-4,6-bis (tribromomethyl)-s-triazine, 2-phenyl-4,6-bis (trichloromethyl)-s-triazine, 2-(p-methoxyphenyl)-4,6-bis (trichloromethyl)-s-triazine, 2-(p-methylthio-phenyl)-4,6-bis(trichloromethyl)-s-triazine, 2-(p-chlorophenyl)-4,6-bis (trichloromethyl)-s-triazine, 2-(2,4-dichlorophenyl)-4,6-bis (trichloromethyl)-s-triazine, 2-(p-bromophenyl)-4,6-bis (trichloromethyl)-s-triazine, 2-(p-tolyl)-4,6-bis (trichloromethyl)-s-triazine, 2-(p-methoxyphenyl)-4,6-bis (trichloromethyl)-s-triazine, 2-n-propyl-4,6-bis (trichloromethyl)-s-triazine, 2-(α, α, β-trichloroethyl)-4,6-bis(trichloromethyl)-s-triazine, 2-styryl-4,6-bis (trichloromethyl)-s-triazine, 2-(p-methoxystyryl)-4,6-bis (trichloromethyl)-s-triazine, 2-(o-methoxystyryl-4,6-bis (trichloromethyl)-s-triazine, 2-(p-butoxystyryl)-4,6-bis (trichloromethyl)-s-triazine, 2-(3,4-dimethoxystyryl)-4,6-bis(trichloromethyl)-s-triazine, 2-(3,4,5-trimethoxystyryl)-4,6-bis (trichloromethyl)-s-triazine, etc.

Concrete examples of the diphenyliodonium salt compound represented by the general formula (3) include chloride, bromide, tetrafluoroborate, hexafluorophosphate, hexafluoroarsenate, hexafluoroantimonate and trifluoromethane sulfonate of diphenyliodonium, bis(p-chlorophenyl)iodonium, ditolyliodonium, bis(p-tert-butylphenyl)iodonium, bis(m-nitrophenyl)iodonium, p-tert-butylphenyl phenyliodonium, methoxyphenyl phenyliodonium, p-octyloxyphenyl phenyliodoium, and the like. From the standpoint of solubility of the compound, in particular, it is desired to use tetrafluoroborate, hexafluorophosphate, hexafluoroarsenate, hexafluoroantimonate and trifluoromethane sulfonate.

The photo acid generator which is the component (B) used in the visible-ray polymerization initiator of the present invention is not limited to the above-mentioned photo acid generators only but may be any known compound without any limitation provided it forms a BrØnsted acid or a Lewis acid upon irradiation with light, and is decomposed by the photo-sensitizing dye which is the component (A) of the present invention upon irradiation with visible rays to generate an acid.

Examples of the photo acid generator in addition to the above-mentioned examples include sulfonium salt compound, sulfonic ester compound, disulfone compound and diazonium salt compound.

Other concrete examples of the photo acid generator that can be favorably used in the present invention include sulfonium salt compounds such as triphenylsulfonium tetrafluoroborate, triphenylsulfonium hexafluorophosphinate, triphenylsulfonium hexafluoroantimonate, triphenylsulfonium trifluoromethane sulfonate, p-methoxyphenyl diphenylsulfonium hexafluoroantimonate, p-methoxyphenyldiphenylsulfonium trifluoromethane sulfonate, p-toluenediphenylsulfonium hexafluoroantimonate, p-toluenediphenylsulfonium trifluoromethane sulfonate, mesitylene diphenylsulfonium trifluoromethane sulfonate, p-(t-butyl)phenyldiphenylsulfonium trifluoromethane sulfonate, and the like.

Concrete examples of the sulfonic ester compound include benzoin tosylate, α-methylolbenzoin tosylate, pyrogallol trimesylate, and the like.

Concrete examples of the disulfone compound include diphenyl disulfone, di(p-tolyl)disulfone, and the like, and concrete examples of the diazonium salt compound include sodium naphthoquinone(1,2)diazide(2)-4-sulfonate, sodium naphthoquinone(1,2)diazide(2)-5-sulfonate, tosyl naphthoquinone(1,2)diazide(2)-5-sulfonate, and the like.

The above-mentioned photo acid generators may be used in a single kind or being mixed together in two or more kinds. The amount of addition to the visible-ray polymerization initiator is preferably from 0.005 to 95% by weight and, more preferably, from 0.01 to 90% by weight. When the amount of addition is smaller than 0.005% by weight, the polymerization proceeds little. When the amount of addition exceeds 90% by weight, on the other hand, properties of the cured product are deteriorated, e.g., weatherability and hardness of the cured product are deteriorated.

As for the combination of the photo-sensitizing dye which is the component (A) and the photo acid generator which is the component (B) of the present invention, the combination of a coumarin dye as the component (A) and a trihalo-alkyl substituted -s-triazine derivative or a diphenyliodonium salt compound as the component (B), induces highly efficient energy transfer to effectively promote the decomposition of the aryl borate compound which is the component (C).

[Aryl Borate Compound (C)]

A typical example of the aryl borate compound (C) of the present invention is represented by the following formula (4).

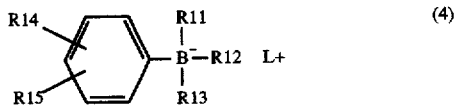

wherein R11, R12 and R13 are each independently selected from a substituted or unsubstituted alkyl group, a substituted or unsubstituted aryl group, a substituted or unsubstituted aralkyl group, and a substituted or unsubstituted alkenyl group, R14 and R15 are each independently selected from a hydrogen atom, a halogen atom, a substituted or unsubstituted alkyl group, a substituted or unsubstituted alkoxy group, a substituted or unsubstituted phenyl group, and a nitro group, and L+ is a metal ion or an organic base ion.

In the above-mentioned formula (4), the organic base ion L+ may be a quaternary ammonium ion, a quaternary pyridinium ion, a quaternary quinolinium ion, a phosphonium ion, or the like ion.

The aryl borate compound without at all containing boron-aryl bond has very poor preservation stability and easily undergoes decomposition upon reacting with oxygen in the air, which is not desirable.

The aryl borate compound that can be favorably used in the invention has an aryl group in a molecule.

Examples of the aryl borate compound having one aryl group in a molecule include sodium salt, lithium salt, potassium salt, magnesium salt, tetrabutyl ammonium salt, tetramethyl ammonium salt, tetraethyl ammonium salt, methyl pyridinium salt, ethyl pyridinium salt, butyl pyridinium salt, methyl quinolinium salt, ethyl quinolinium salt and butyl quinolinium salt of trialkylphenylboron, trialkyl (p-chlorophenyl)boron, trialkyl(p-fluorophenyl)boron, trialkyl(3,5-bistrifluoromethyl)phenylboron, trialkyl[3,5-bis (1,1,1,3,3,3-hexafluoro-2-methoxy-2-propyl)-phenyl]boron, trialkyl(p-nitrophenyl)boron, trialkyl(m-nitrophenyl)boron, trialkyl(p-butylphenyl)boron, trialkyl(m-butylphenyl)boron, trialkyl(m-butyloxyphenyl)boron, trialkyl(m-octyloxyphenyl)boron and trialkyl(p-octyloxyphenyl)boron (alkyl group is n-butyl group, n-octyl group, n-dodecyl group, etc.).

Examples of the aryl borate compound having two aryl groups in one molecule include sodium salt, lithium salt, potassium salt, magnesium salt, tetrabutyl ammonium salt, tetramethyl ammonium salt, tetraethyl ammonium salt, methyl pyridinium salt, ethyl pyridinium salt, butyl pyridinium salt, methyl quinolinium salt, ethyl quinolinium salt and butyl quinolinium salt of dialkyldiphenylboron, dialkyldi(p-chlorophenyl)boron, dialkyldi(p-chlorophenyl) boron, dialkyldi(3,5-bistrifluoromethyl)phenylboron, dialkyldi[3,5-bis(1,1,1,3,3,3-hexafluoro-2-methoxy-2-propyl)phenyl]boron, dialkyldi(p-nitrophenyl)boron, dialkyldi(m-nitrophenyl)boron, dialkyldi(p-butylphenyl) boron, dialkyldi(m-butylphenyl)boron, dialkyldi(m-butyloxyphenyl)boron, dialkyldi(m-octyloxyphenyl)boron, and dialkyldi(p-octyloxyphenyl)boron (alkyl group is as defined above).

Examples of the aryl borate compound having three aryl groups in one molecule include sodium salt, lithium salt, potassium salt, magnesium salt, tetrabutyl ammonium salt, tetramethyl ammonium salt, tetraethyl ammonium salt, methyl pyridinium salt, ethyl pyridinium salt, butyl pyridinium salt, methyl quinolinium salt, ethyl quinolinium salt and butyl quinolinium salt of monoalkyltriphenylboron, monoalkyltri(p-chlorophenyl)boron, monoalkyltri(p-chlorophenyl)boron, monoalkyltri(3,5-bistrifluoromethyl) phenylboron, monoalkyltri[3,5-bis(1,1,1,3,3,3-hexafluoro-2-methoxy-2-propyl)-phenyl]boron, monoalkyltri(p-nitrophenyl)boron, monoalkyltri(m-nitrophenyl)boron, monoalkyltri(p-butylphenyl)boron, monoalkyltri(m-butylphenyl)boron, monoalkyltri(m-butyloxyphenyl)boron, monoalkyltri(m-octyloxyphenyl)boron, and monoalkyltri(p-octyloxyphenyl)boron (alkyl group is as defined above).

Examples of the aryl borate compound having four aryl groups in one molecule include sodium salt, lithium salt, potassium salt, magnesium salt, tetrabutyl ammonium salt, tetramethyl ammonium salt, tetraethyl ammonium salt, methyl pyridinium salt, ethyl pyridinium salt, butyl pyridinium salt, methyl quinolinium salt, ethyl quinolinium salt and butyl quinolinium salt of tetraphenylboron, tetrakis(p-fluorophenyl)boron, tetrakis(p-chlorophenyl)boron, tetrakis (3,5-bistrifluoromethyl)phenylboron, tetrakis [3,5-bis(1,1,1,3,3,3-hexafluoro-2-methoxy-2-propyl)phenyl]boron, tetrakis(p-nitrophenyl)boron, tetrakis(m-nitrophenyl)boron, tetrakis(p-butylphenyl)boron, tetrakis(m-butylphenyl) boron,tetrakis(m-butyloxyphenyl)boron, tetrakis(m-octyloxyphenyl)boron, tetrakis(p-octyloxyphenyl)boron, (p-fluorophenyl)triphenylboron, (3,5-bistrifluoromethyl) phenyltriphenylboron, (p-nitrophenyl)triphenylboron, (m-butyloxyphenyl)-triphenylboron, (p-butyloxyphenyl) triphenylboron, (m-octyloxyphenyl)triphenylboron and (p-octyloxyphenyl)triphenylboron (alkyl group is as defined above).

The aryl borate compounds may be used in a single kind or being mixed together in two or more kinds.

To use the visible-ray polymerization initiator of the present invention in the presence of an acidic group-containing monomer, it is desired to use a tri- or tetraphenyl borate compound in order to prevent the aryl borate compound from being quickly decomposed with acid.

The amount of the aryl borate compound to be blended is determined depending upon the kind and amount of the polymerizable monomer and the amounts of other components. Usually, however, the aryl borate compound is added to the visible-ray polymerization initiator in an amount of from 0.01% by weight to 95% by weight and, preferably, from 0.05% by weight to 90% by weight based on the total weight of the three components (A) (B) and (C). When the amount of addition is smaller than 0.01% by weight, the polymerization does not proceed. When the amount of addition is larger than 95% by weight on the other hand, properties of the polymer are deteriorated, i.e., hardness of the cured product decreases, which is not desirable.

The components (A), (B) and (C) in the visible-ray polymerization initiator of the present invention are essential components. The above-mentioned components can be used in kinds and amounts within ranges as described above. When used for the polymerization initiator for dental applications, in particular, it is desired that the kinds and amounts of the three components are such that the component (A) which is a coumarin dye having a maximum absorption wavelength of from 400 to 500 nm is added in an amount of from 0.00005% by weight to 30% by weight, the component (B) which is a photo acid generator of the type of trichloromethyl triazine having two or three trichloromethyl groups or of the type of diphenyliodonium salt having, as pair anions, tetrafluoroborate, hexafluorophosphate, hexafluoroantimonate or trifluoromethane sulfonate ions, is added in an amount of from 0.05 to 80% by weight, and the component (C) which is a tetraaryl borate compound which is not substituted or is substituted with an alkoxy group at the m-position of the aryl group, or a tri- or tetraaryl borate compound having an aryl group substituted with fluorine or a trifluoromethyl group, is added in an amount of from 0.05 to 90% by weight based on the total weight of the three componets (A) (B) and (C).

When the visible-ray polymerization initiator comprises the components (B) and (C) only without the component (A), i.e., without the photo-sensitizing dye (A), no polymerization takes place upon irradiation with visible rays since no ray is absorbed over a wavelength region of visible rays. When the visible-ray polymerization initiator comprises the components (A) and (B) only or the components (A) and (C) only, furthermore, sufficiently high sensitivity is not obtained, irradiation must be continued for extended periods of time to accomplish the curing and, besides, the cured polymer fails to exhibit sufficient degree of hardness.

The mechanism for starting the polymerization of the visible-ray polymerization initiator of the present invention has not yet been clarified but is considered to be as described below. That is, the photosensitizing dye which is the component (A) absorbs energy of visible rays and is excited from the ground state to the excited state, which is a cause of energy transfer to for the photo acid generator which is the component (B). Due to this energy, the photo acid generator decomposes giving rise to the formation of active acid excited with light. It is then considered that the acid decomposes the aryl borate compound which is the component (C) to form a trivalent boron compound. The trivalent boron compound easily reacts with oxygen in the system and forms a polymerizable radical species causing the polymerizable monomer to polymerize.

As described above, therefore, the polymerization does not often proceed by a combination of a photo acid generator and a dye which is not capable of efficiently energy transfer. With only an acid, such as hydrochloric acid and an acidic group-containing monomer, furthermore, activity is not sufficient and the polymerization does not proceed to a sufficient degree.

The visible-ray polymerization initiator of the present invention can be used in combination with known polymerization initiators which have been used for thermal polymerization, for ultraviolet rays or for visible rays. There is no limitation on the other polymerization initiators. As the thermal polymerization initiator, there can be exemplified peroxides such as benzoyl peroxide, p-chlorobenzoyl peroxide, tert-butylperoxy-2-ethyl hexanoate, tert-butyl peroxydicarbonate and diisopropyl peroxydicarbonate, as well as azo compounds such as azobisisobutylonitrile and the like.

As the ultraviolet-ray or visible-ray polymerization initiator, there can be exemplified α-diketones such as diacetyl, acetylbenzoyl, benzyl, 2,3-pentadion, 2,3-octadion, 4,4'-dimethoxybenzyl, 4,4'-oxybenzyl, camphorquinone, 9,10-phenanthrenequinone and acenaphthenequinone; benzoinalkyl ethers such as benzoinmethyl ether, benzoinethyl ether, and benzoinpropyl ether; thioxanthone derivatives such as 2,4-diethoxythioxanthone, 2-chlorothioxanthone, and methylthioxanthone; benzophenone derivatives such as benzophenone, p,p'-dimethylaminobenzophenone, and p,p'-methoxybenzophenone; and acylphosphine oxide derivatives such as 2,4,6-trimethylbenzoyldiphenyl-phosphine oxide, and bis(2,6-dimethoxybenzoyl)-2,4,4-trimethylpentylphosphine oxide.

Particularly preferred examples are photo-polymerization initiators of α-diketones or the acylphosphine oxide type. Among them, camphorquinone, 2,4,6-trimethylbenzoyldiphenylphosphine oxide, and bis(2,6-dimethoxybenzoyl)-2,4,4-trimethylpentylphosphine oxide are preferred.

The above-mentioned polymerization initiators are used not only in one kind but also in a combination of plural kinds, as required.

It is desired that other polymerization initiators are added in an amount of from 0 to 200 parts by weight and, preferably, from 0 to 150 parts by weight per 100 parts by weight of the total of the components (A), (B) and (C).

The visible-ray polymerization initiator of the present invention is useful when it is added to the polymerizable monomer and is irradiated with visible rays. In particular, a polymerizable composition for dental use exhibiting favorable adhesiveness to the tooth substrate is obtained when it is used in combination with a (meth)acrylate monomer which contains not smaller than 5% by weight of an acidic group-containing (meth)acrylate monomer as a polymerizable monomer.

Any known acidic group-containing (meth)acrylate monomer and (meth)acrylate monomer can be used without any particular limitation.

Any known acidic group-containing (meth)acrylate monomer that has generally been favorably used can be used without any particular limitation provided it has an acidic group such as carboxylic acid group or an anhydride thereof or a phosphoric acid group in the molecules thereof. A typical acid-group-containing (meth)acrylate monomer is represented by the following general formula (5),

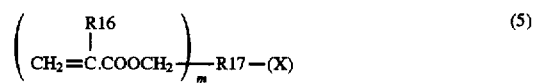

m = 1–4
n = 1,2 wherein R16 is a hydrogen atom or a methyl group, R17 is a divalent to hexavalent organic residue with 1 to 20 carbon atoms which may have an ether bond and/or an ester bond, and X is a carboxyl group, an anhydrous carboxyl group, a phosphoric acid group, or a group including a phosphoric ester group.

In the above-mentioned general formula (5), X is a carboxylic acid group, an anhydrous carboxylic acid group, a phosphoric acid group, or a group containing a phosphoric ester group. Though there is no particular limitation in the structure, the following are preferred structures.

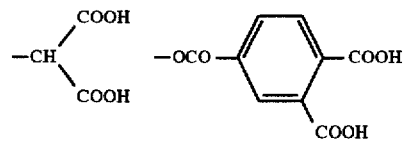

-continued

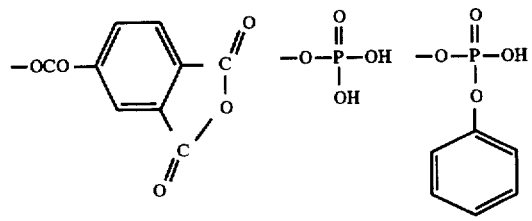

In the above-mentioned general formula (5), R17 is a divalent to hexavalent organic residue with 1 to 20 carbon atoms having a known ether bond and/or an ester bond, and there is no particular limitation on the structure thereof. Its concrete examples are as follows:

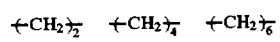

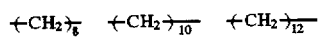

-continued

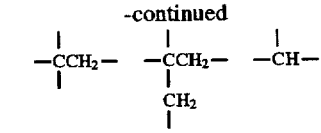

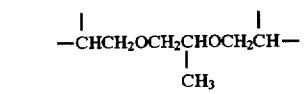

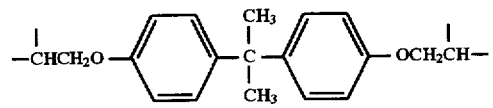

Preferred examples of the acidic group-containing (meth) acrylate monomer represented by the above-mentioned general formula (5) are as follows:

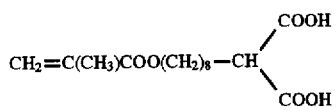

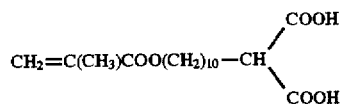

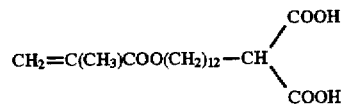

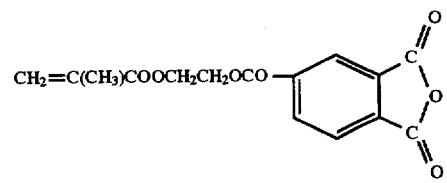

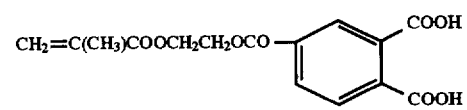

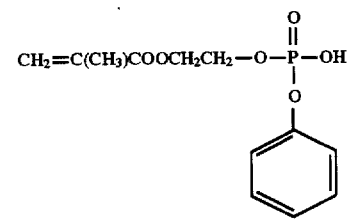

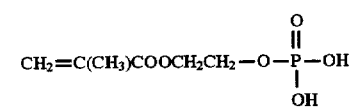

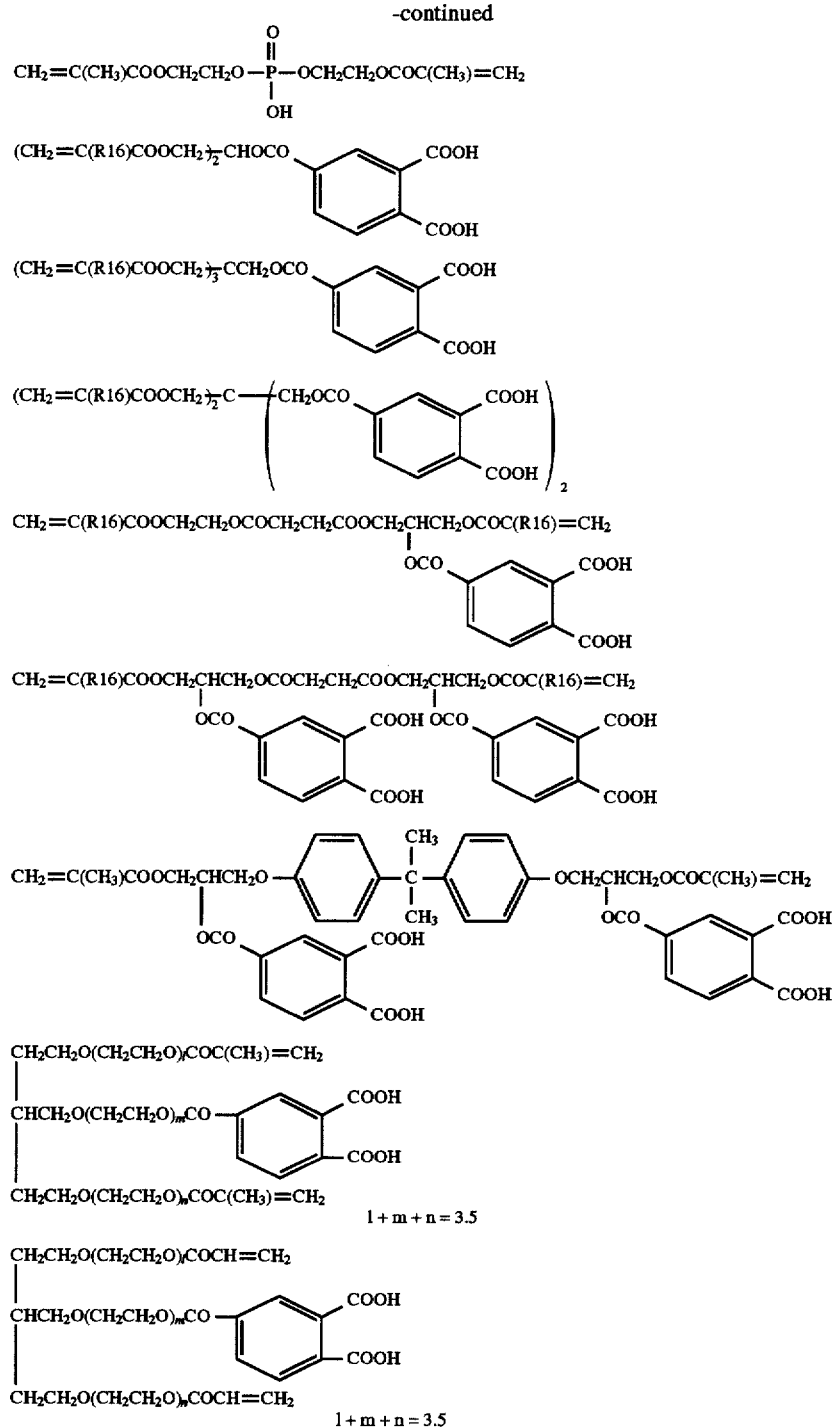

wherein R16 is a hydrogen atom or a methyl group.

When the visible-ray polymerizable composition of the present invention is used for dental applications, it is particularly desired to use the one having a carboxyl group and a phosphoric acid group among the acidic group-containing (meth)acrylate monomers concretely exemplified above from the standpoint of adhesiveness to the tooth substrate.

According to the present invention, it is essential that the acidic group-containing (meth)acrylate monomer is blended in an amount of not smaller than 5 parts by weight and, preferably, in an amount of from 10 parts by weight to 80 parts by weight per 100 parts by weight of the whole (meth)acrylate monomer from the standpoint of adhesiveness to the tooth substrate.

As the other (meth)acrylate monomer used in the present invention, any known compound may be used without any particular limitation. Preferred examples of the (meth) acrylate monomer include mono(meth)-acrylate monomers such as methyl(meth)acrylate, ethyl (meth)acrylate, glycidyl (meth)acrylate, 2-cyanomethyl (meth)acrylate, benzyl (meth)acrylate, polyethylene glycol mono(meth)acrylate, allyl(meth)acrylate, 2-hydroxyethyl(meth)acrylate, glycidyl (meth)acrylate, 3-hydroxypropyl(meth)acrylate, and glycerylmono(meth)-acrylate; and polyfunctional (meth) acrylate monomers such as ethylene glycol di(meth)acrylate, diethylene glycol di(meth)acrylate, triethylene glycol di(meth)acrylate, nonaethylene glycol di(meth)acrylate, propylene glycol di(meth)acrylate, dipropylene glycol di(meth)acrylate, 2,2'-bis[4-(meth)acryloyloxyethoxyphenyl]propane, 2,2'-bis[4-(meth)acryloyloxyethoxyethoxyphenyl]propane, 2,2'-bis[4-(meth)acryloyloxyethoxyethoxyethoxyethoxyethoxyethoxy-ethoxyethoxyethoxy-phenyl]propane, 2,2'-bis{4-[3-(meth)acryloyloxy-2-hydroxypropoxy]phenyl}propane, 1,4-butanediol di(meth)acrylate, 1,6-hexanediol dimethacrylate, trimethylolpropanetri(meth)acrylate, urethane(meth)acrylate, and epoxy(meth)acrylate. These (meth)acrylate monomers may be used in a single kind or being mixed together in two or more kinds.

In polymerizing a visible-ray polymerizable composition of the present invention, other polymerizable monomers than the above-mentioned (meth)acrylate monomer are often mixed and polymerized to facilitate the polymerization of the composition, to adjust the viscosity and to adjust other physical properties. Examples of these polymerizable monomers include fumaric ester compounds such as monomethyl fumarate, diethyl fumarate and diphenyl fumarate; styrene or α-methylstyrene derivatives such as styrene, divinylbenzene, α-methylstyrene and α-methylstyrene dimer; and allyl compounds such as diallyl phthalate, diallyl terephthalate, diallyl carbonate and allyl diglycol carbonate, and the like. These other polymerizable monomers may be used alone or in a combination of two or more kinds.

In the present invention which uses a photo acid generator, furthermore, it is also allowable to use in combination a compound capable of initiating the polymerization with acid, i.e., to use other cationic-polymerizable monomers. Preferred examples of the cationic-polymerizable monomers include epoxy compounds such as diglycerolpolyglycidyl ether, pentaerythritolpolyglycidyl ether, 1,4-bis(2,3-epoxypropoxyperfluoroisopropyl) cyclohexane, sorbitolpolyglycidyl ether, trimethylolpropanepolyglycidyl ether, resorcindiglycidyl ether, 1,6-hexanedioldiglycidyl ether, polyethylene glycoldiglycidyl ether, phenylglycidyl ether, p-tert-butylphenylglycidyl ether, diglycidyl adipic ether, o-diglycidyl phthalic ether, dibromophenylglycidyl ether, 1,2,7,8-diepoxyoctane, 4,4'-bis(2, 3-epoxypropoxyperfluoroisopropyl)diphenyl ether, 3,4-epoxycyclohexylmethyl-3',4'-epoxycyclohexane carboxylate, 3,4-epoxycyclohexyloxylane, and ethylene glycol-bis(3,4-epoxycyclohexane carboxylate); and vinyl ether compounds such as vinyl-2-chloroethyl ether, vinyl-n-butyl ether, triethylene glycol divinyl ether, 1,4-cyclohexanedimethanol divinyl ether, trimethylolethane trivinyl ether, and vinylglycidyl ether. These compounds may be used alone or in a combination of two or more kinds.

These other polymerizable monomers may be blended in amounts that vary depending upon the object but are preferably used in amounts of from 0 to 200 parts by weight per 100 parts by weight of the above-mentioned (meth)acrylate monomer.

According to the present invention, the visible-ray polymerization initiator is added to the visible-ray polymerizable composition in an amount of from 0.01 to 10 parts by weight and, preferably, from 0.05 to 5 parts by weight per 100 parts by weight of the whole polymerizable monomers in the composition. When the amount of the visible-ray polymerization initiator is smaller than 0.01 part by weight, the polymerization does not proceed sufficiently. When its amount exceeds 10 parts by weight, on the other hand, properties such as hardness and weatherability of the cured product decrease, which is not desirable.

Addition of water is effective for using the visible-ray polymerizable composition of the present invention as an adhesive for adhering a composite resin to the tooth substrate. Addition of water promotes the decalcification of hydroxyapatite in the tooth substrate making it possible to further increase the adhesive force. The amount of addition is suitably determined depending upon the kind of the composition and the kind of the polymerization initiator. Usually, however, water is added in an amount of from 2 to 30 parts by weight and, preferably, from 4 to 25 parts by weight per 100 parts by weight of the polymerizable composition. When the amount of water is smaller than the above-mentioned range, the effect of decalcification is small. When the amount of water exceeds the above-mentioned range, on the other hand, the strength of the cured product decreases greatly.

According to the present invention, a cation-deliverable filler may be added to the visible-ray polymerizable composition in order to increase the strength of the cured product.

A widely known cation-deliverable filler can be used for the present invention without any limitation. A preferred cation-deliverable filler is the one which when it is immersed in an amount of one gram in 50 ml of an acrylic acid aqueous solution having a pH of 2.2 maintained at a temperature of 37° C. for 24 hours, polyvalent metal ions are eluted in amounts of from 2 mgeq/g to 60 mgeq/g. More preferably, the polyvalent metal ions should be eluted in amounts of from 5 mgeq/g to 30 mgeq/g. When the polyvalent metal ions are eluted in amounts of from 2 mgeq/g to 60 mgeq/g, the filler that does not dissolve exists in suitable amounts contributing to increasing the strength of the cured product. Here, polyvalent metal ions are those metal ions having a valency of two or more and are capable being bonded to acidic groups of the acidic group-containing (meth)acrylic monomer. Representative examples are metal ions such as of calcium, strontium, barium, aluminum, zinc and lanthanide.

Though there is no particular limitation, preferred examples of the cation-deliverable filler include hydroxides such as calcium hydroxide and strontium hydroxide, and oxides such as zinc oxide, silicate glass and fluoroaluminosilicate glass. Among them, the fluoroaluminosilicate glass is most desired from the standpoint of not causing the cured product to be colored.

The fluoroaluminosilicate glass may be the widely known one that has been used as a dental cement such as glass ionomer cement. The widely known fluoroaluminosilicate glass has a composition, in terms of percent by ionic weight, of 10 to 33 of silicon, 4 to 30 of aluminum, 5 to 36 of alkaline earth metal, 0 to 10 of alkali metal, 0.2 to 16 of phosphorus, 2 to 40 of fluorine, and the residue of oxygen. More preferably, the fluoroaluminosilicate glass has a composition of 15 to 25 of silicon, 7 to 20 of aluminum, 8 to 28 of alkaline earth metal, 0 to 10 alkali metal, 0.5 to 8 of phosphorus, 4 to 40 of fluorine, and the residue of oxygen. It is desired that part or whole of the alkaline earth metal is magnesium, strontium or barium. In particular, strontium is often used to impart X-ray blocking property and large strength to the cured product. In general, furthermore, the alkali metal is in most cases sodium, and it is desired that part or whole of it is substituted by lithium or potassium. As required, furthermore, aluminum may be partly substituted by titanium, yttrium, zirconium, hafnium, tantalum or lanthanum. As required, furthermore, the above-mentioned components may be substituted by other components as far as they do not seriously damage the properties of the obtained cured product.

Though there is no particular limitation in the amount of the cation-deliverable filler used in the present invention, it is desired that the cation-deliverable filler is used in an amount of from 3 to 30 parts by weight and, preferably, from 5 to 25 parts by weight per 100 parts by weight of the whole monomers that are used. When the amount of the cation-deliverable filler lies within the above-mentioned range, it becomes easy to uniformly disperse the cation-deliverable filler in the polymerizable composition.

There is no particular limitation in the shape of the cation-deliverable filler that is used in the present invention; i.e., the cation-deliverable filler may be in the form of pulverized particles obtained by ordinary pulverizing or in the form of spherical particles. As required, furthermore, plate-like or fibrous particles may be mixed thereto.

The cation-deliverable filler has a particle diameter of usually not larger than 50 μm and, preferably, not larger than 20 μm though there is no particular limitation.

Moreover, an organic solvent, a filler and a viscosity-imparting agent may be added to the composition of the present invention in such amounts that will not impair the properties of the composition. Examples of the organic solvent include hexane, heptane, octane, toluene, dichloromethane, chloroform, methanol, ethanol, isopropanol, acetone, methyl ethyl ketone, pentanone, hexanone, ethyl acetate, propyl acetate and dimethyl sulfoxide. Examples of the filler include inorganic fillers such as glasses, silicon oxide, titanium oxide, zirconium oxide, aluminum oxide, silicon-zirconium composite oxide, silicon-titanium composite oxide, barium sulfate and calcium carbonate; organic fillers such as polymethyl methacrylate, polyethyl methacrylate, polyvinyl chloride and polystyrene; as well as inorganic-organic composite fillers. Examples of the viscosity-imparting agent include polymer compounds such as polyvinyl pyrrolidone, carboxymethyl cellulose and polyvinyl alcohol, as well as highly dispersing silica.

In carrying out the polymerization, furthermore, there may be selectively used a variety of additives such as filler, ultraviolet-ray absorbing agent, dye, antistatic agent, pigment, perfume, etc. as required.

When the visible-ray polymerizable composition of the present invention is to be polymerized and cured, there can be used a source of visible rays such as carbon arc, xenon lamp metal halide lamp, tungsten lamp, fluorescent lamp, sunlights helium-cadmium laser or argon laser without any limitation. The irradiation time varies depending upon the wavelength and intensity of the source of light, shape and material of the polymer, and should, hence, be determined in advance by conducting preliminary experiment.

In the visible-ray polymerizable composition of the present invention, all of the components are finally mixed together. In order to prevent degradation during the preservation, however, the composition, as required, may be stored being divided into two packages that remain stable. Generally, for instance, the visible-ray polymerizable composition is stored being divided into a package (A) of the acidic group-containing (meth)acrylate monomer, part of the (meth)acrylate monomer, the photo-sensitizing dye and the photo acid generator, and a package (B) of the aryl borate compound and part of the (meth)acrylate monomer.

EXAMPLES

The invention will now be concretely described by way of Examples to which only, however, the invention is in no way limited. The compounds used in the specification and Examples, and their abbreviations are described below.

3G:

POH:

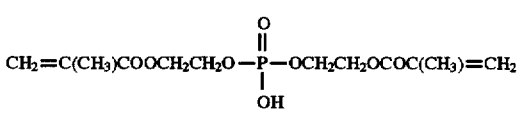

MTS:

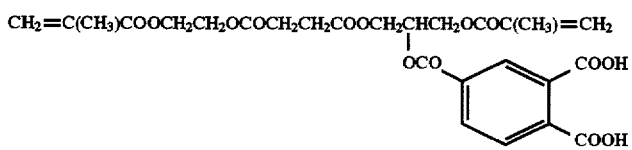

MAC-10:

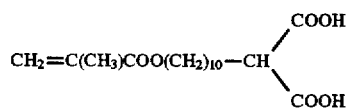

HEMA:

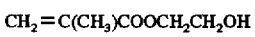

Bis-GMA:

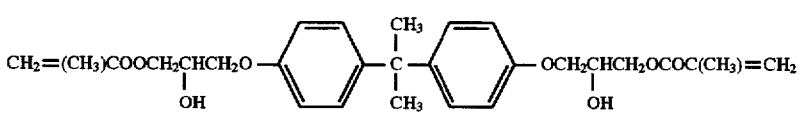

CM334:
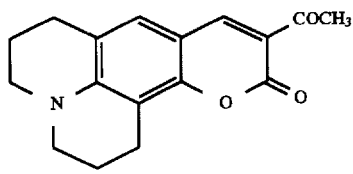
CM6:
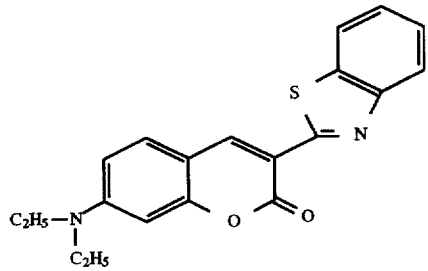
CM7:
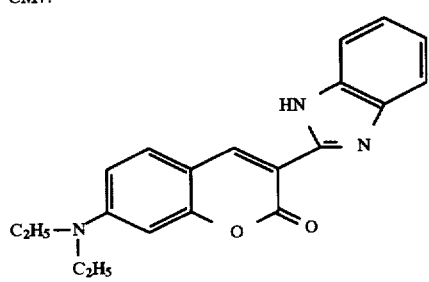
TBTC:
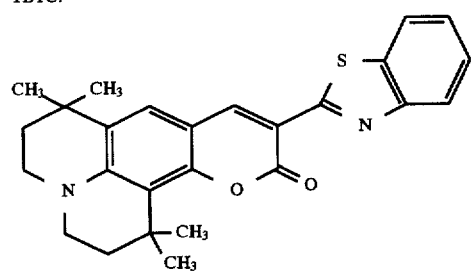
CDAC:
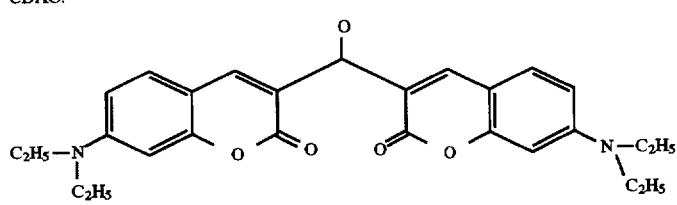
DPYP:
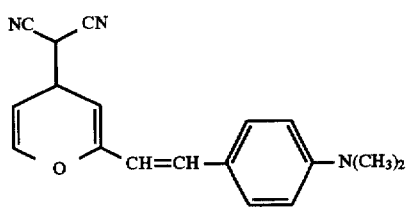
DIHIB:
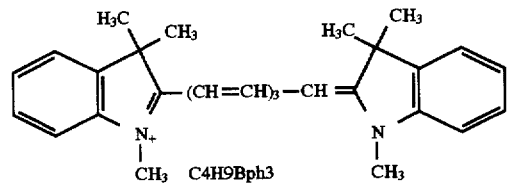
DPENT:
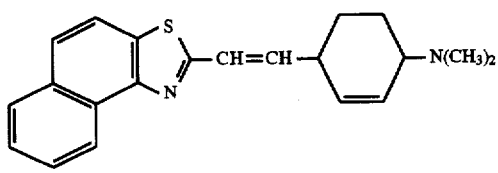
ETTT:
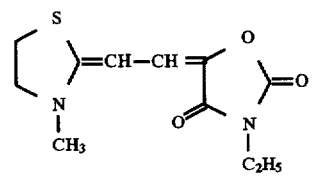
CY-1:
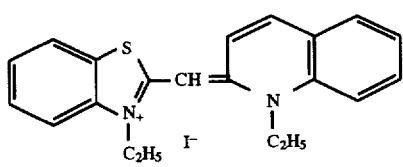
XA-1:
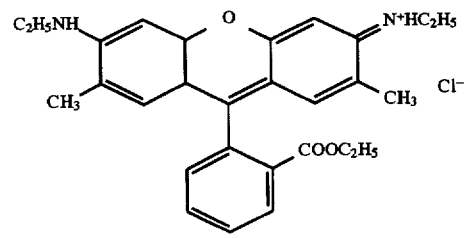

-continued

-continued
FPBNa:
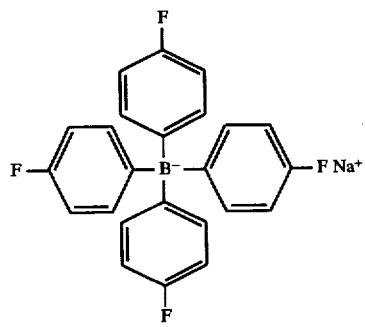
ClPBK:
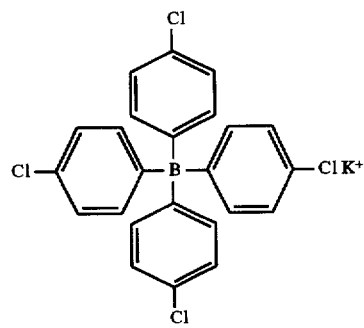
DFPBNa:
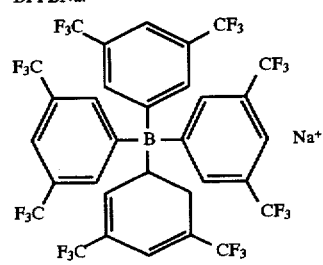
DMPBNa:
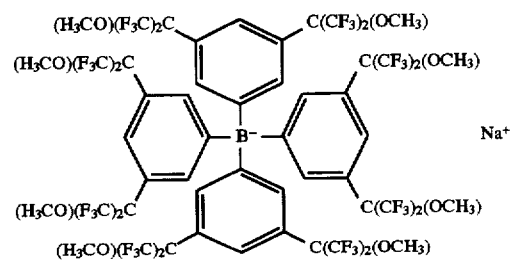
BFPBNa:
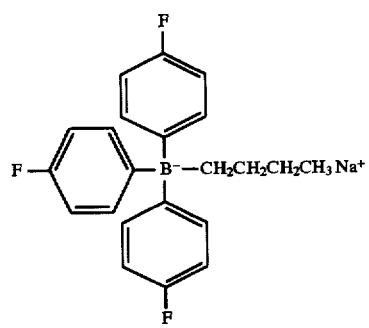
BDFPBNa:
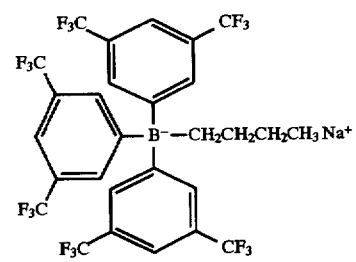
BFPBB:
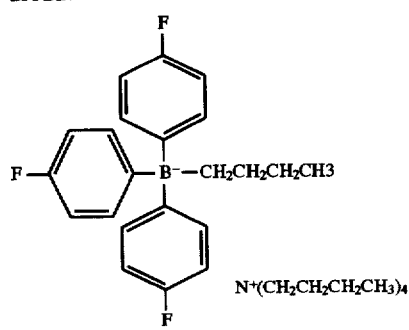
BFPBP:
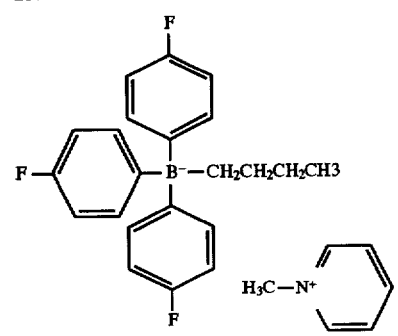
CQ:
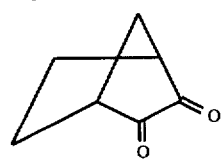
DMBE:
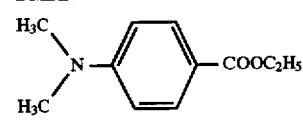

-continued
TPO:
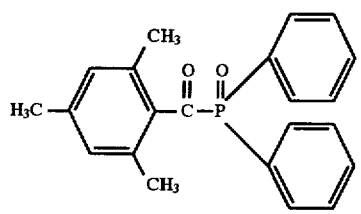
BDTPO:
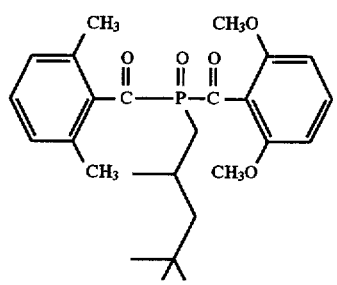
PBNa:
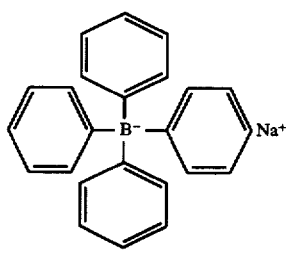
m-C4PBNa:
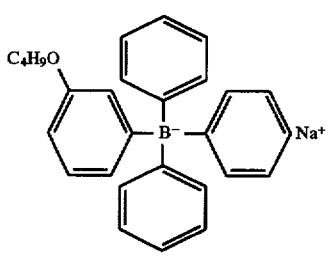
m-C8PBNa:
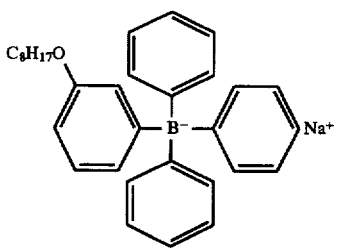
4m-C4PBNa:
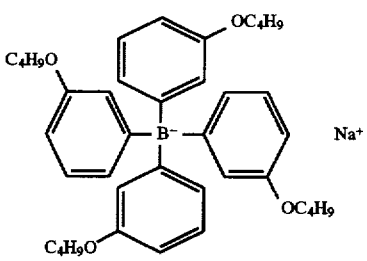
4m-C8PBNa:
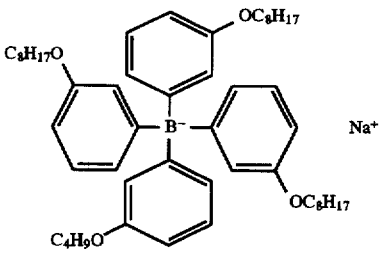
PBBNa:
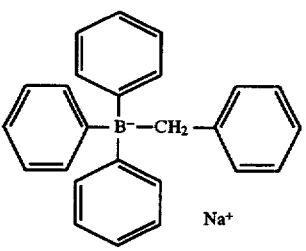
m-BuPBNa:
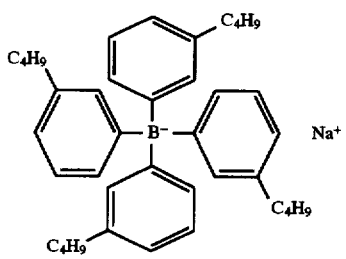
m-OcPBNa:
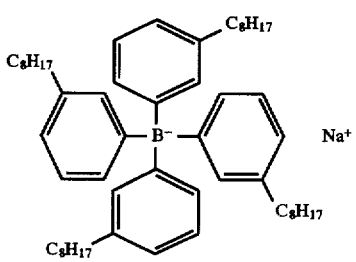

NPBNa:
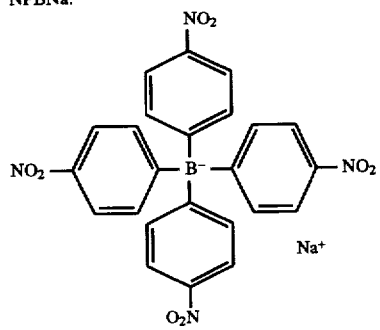

BPBNa:
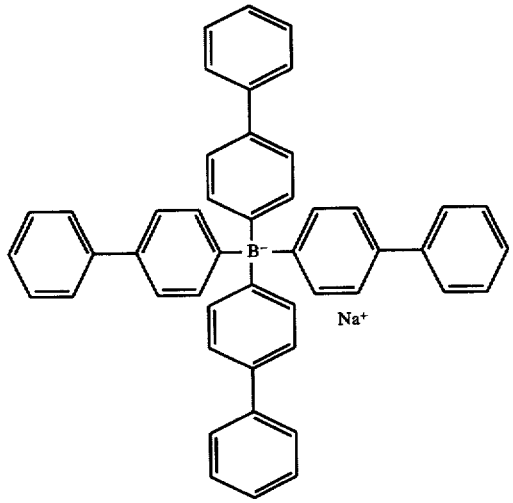

TPS-1:
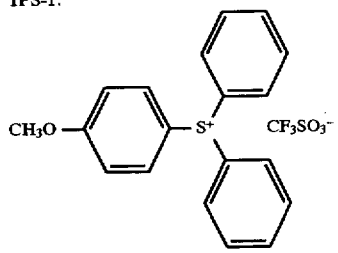

SE-1:
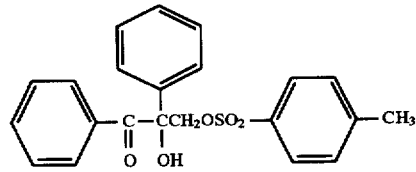

SE-2:
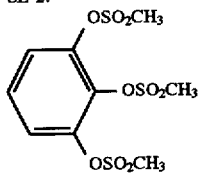

DPS-1:
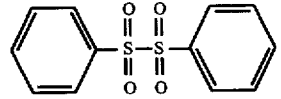

DAS-1:
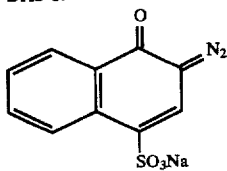

NAT:
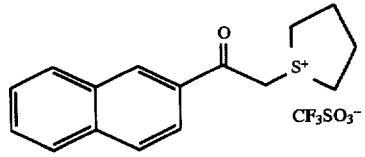

MTPS:
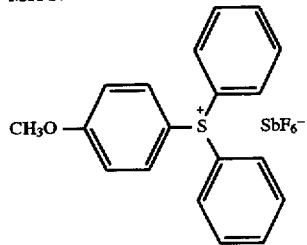

NAT:
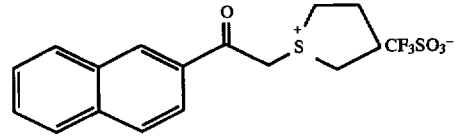

The materials appearing in the specification and Examples were evaluated for their properties according to the methods as described below.

(1) Gelation Time.

One gram of a 3G solution (produced by Shin-Nakamura Kagaku Co.) containing a visible-ray polymerization initiator of the present invention was introduced into a 5-ml sampling tube, so that the film could be cured in a thickness of 7 mm. The solution was then irradiated with light using a visible-ray irradiator (Cold Light, manufactured by Hoya-Scott Co.) from an irradiation distance of 1.5 cm. The time after which the monomer lost fluidity was regarded to be a gelation time.

(2) Curability and Stickiness on the Surface.

After irradiated with visible rays for three minutes in the same manner as described above, the hardness of the cured product and stickness on the surface were evaluated in five stages. That is, the samples having a sufficiently large hardness without any stickiness on the surface are represented by the samples having a sufficiently large hardness and stickiness on the surface are represented by ○, the samples in a jelly-like form having unpolymerized monomer on the surface are represented by Δ, the samples which are partly in a jelly-like form are represented by X, and the samples which are not at all cured are represented by XX.

(3) Adhesion Strength to the Enamel and Dentin.

A bovine foretooth pulled out within 24 hours after slaughtering was ground in parallel with the surface of the lips by using a #800 emery paper while pouring water until the enamel or the dentin was exposed. Then, the compressed air was blown to the thus ground surface for about 10 seconds to dry it. To the surface was stuck a double-sided tape having a hole of a diameter of 4 mm, and on which was secured a perforated paraffin wax having a thickness of 1.5 mm and a diameter of 6 mm in concentric with the above-mentioned hole thereby to form a mimic cavity. The visible-ray polymerizable composition of the present invention was applied into the mimic cavity, left to stand for one minute, and was cured upon being irradiated with light using a visible-ray irradiator (White Light, manufactured by Takara-Belmont Co.) for 30 seconds. Then, a dental composite resin (Palfique ESTELITE, produced by Tokuyama Co.) was applied thereon and was irradiated with light using the visible-ray irradiator for 30 seconds to prepare a test piece.

The adhered test piece was immersed in water maintained at 37° C. for 24 hours and was then measured for its adhesion strength to the tooth by using a tension tester (Autograph, manufactured by Shimazu Seisakusho Co.) at a crosshead speed of 10 mm/min.

Example 1

To 100 parts by weight of 3G were added 0.05 parts by weight of CDAC, 1 part by weight of TCT and 1 part by weight of FPBNa, and were dissolved in a dark place to obtain a visible-ray polymerizable composition solution. Then, 1 g of this solution was introduced into a 5-ml sampling tube and was irradiated with light for three minutes. The gelation time in this case was 6 seconds, and the hardness of the cured product and stickiness on the surface were evaluated to be.

Examples 2 to 62

The 3G solution containing coumarin dyes, photo acid generators and aryl borate compounds shown in Table 1 was used as the visible-ray polymerizable composition and was treated in the same manner as in Example 1. The gelation time, curability and stickiness on the surface were as shown in Table 1.

In all of the Examples, the gelation time was short, and the curability and stickiness on the surface were favorable.

Comparative Examples 1 to 30

The procedure was carried out in the same manner as in Example 1 but blending the components as shown in Table 1. The gelation time, curability and stickiness on the surface were as shown in Table 1.

Comparative Examples 1 to 3 did not contain one of the essential components of the present invention, and could not be polymerized with visible rays. Comparative Examples 4 to 25 employed a dye that does not sensitize or that little sensitizes the photo acid generator. Some compositions did not gel or were geled requiring very extended periods of time. Even when the dye was used in large amounts, the gelation time was much longer than that of the Examples of the invention. Comparative Examples 26 to 28 employed a photo acid generator that was spectrally sensitized with the photo-sensitizing dye and was decomposed but without generating acid. None of the compositions were gelated. Comparative Examples 29 and 30 employed concentrated hydrochloric acid or normal phosphoric acid as an acid. In these cases, the gelation times were very longer than those of the Examples.

TABLE 1

| | Dye | | Photo acid generator | | Aryl borate | | | Curability |
|---|---|---|---|---|---|---|---|---|
| | kind | parts by wt. | kind | parts by wt. | kind | parts by wt. | Gelation time (sec.) | and surface stickiness |
| Example No. | | | | | | | | |
| 2 | CDAC | 0.05 | TCT | 0.2 | FPBNa | 0.2 | 7 | ○ |
| 3 | CDAC | 0.05 | TCT | 0.5 | FPBNa | 0.5 | 6 | ⊙ |
| 4 | CDAC | 0.05 | TCT | 2 | FPBNa | 2 | 5 | ⊙ |
| 5 | CDAC | 0.005 | TCT | 1 | FPBNa | 1 | 7 | ○ |
| 6 | CDAC | 0.5 | TCT | 1 | FPBNa | 1 | 5 | ⊙ |
| 7 | CDAC | 0.05 | TCT | 0.2 | FPBNa | 1 | 5 | ⊙ |
| 8 | CDAC | 0.05 | TCT | 0.2 | FPBNa | 2 | 5 | ⊙ |
| 9 | CDAC | 0.05 | TCT | 2 | FPBNa | 0.2 | 8 | ○ |
| 10 | CDAC | 0.05 | PDCT | 1 | FPBNa | 1 | 6 | ⊙ |
| 11 | CDAC | 0.05 | ClPDCT | 1 | FPBNa | 1 | 6 | ⊙ |
| 12 | CDAC | 0.05 | MPDCT | 1 | FPBNa | 1 | 5 | ⊙ |
| 13 | CDAC | 0.05 | STDCT | 1 | FPBNa | 1 | 6 | ⊙ |
| 14 | CDAC | 0.05 | DPIP | 1 | FPBNa | 1 | 5 | ⊙ |
| 15 | CDAC | 0.05 | DPISb | 1 | FPBNa | 1 | 5 | ⊙ |
| 16 | CDAC | 0.05 | DPIB | 1 | FPBNa | 1 | 7 | ⊙ |
| 17 | CDAC | 0.05 | DPIT | 1 | FPBNa | 1 | 8 | ⊙ |
| 18 | CDAC | 0.05 | MDPISb | 1 | FPBNa | 1 | 8 | ⊙ |
| 19 | CDAC | 0.05 | MDPIT | 1 | FPBNa | 1 | 7 | ⊙ |

TABLE 1-continued

| | Dye | | Photo acid generator | | Aryl borate | | Gelation time (sec.) | Curability and surface stickiness |
|---|---|---|---|---|---|---|---|---|
| | kind | parts by wt. | kind | parts by wt. | kind | parts by wt. | | |
| 20 | CDAC | 0.05 | BDPISb | 1 | FPBNa | 1 | 6 | ⊚ |
| 21 | CDAC | 0.05 | BDPIP | 1 | FPBNa | 1 | 5 | ⊚ |
| 22 | CDAC | 0.05 | TCT | 1 | ClPBK | 1 | 5 | ⊚ |
| 23 | CDAC | 0.05 | TCT | 1 | PFPBNa | 1 | 6 | ⊚ |
| 24 | CDAC | 0.05 | TCT | 1 | DFPBNa | 1 | 7 | ⊚ |
| 25 | CDAC | 0.05 | TCT | 1 | DMPBNa | 1 | 7 | ⊚ |
| 26 | CDAC | 0.05 | TCT | 1 | BFPBNa | 1 | 5 | ⊚ |
| 27 | CDAC | 0.05 | TCT | 1 | BDFPBNa | 1 | 5 | ⊚ |
| 28 | CDAC | 0.05 | TCT | 1 | BFPBB | 1 | 5 | ⊚ |
| 29 | CDAC | 0.05 | TCT | 1 | BFPBP | 1 | 5 | ⊚ |
| 30 | CDAC | 0.05 | TCT | 1 | PBNa | 0.5 | 6 | ⊚ |
| 31 | CDAC | 0.05 | TCT | 1 | PBNa | 1 | 5 | ⊚ |
| 32 | CDAC | 0.05 | TCT | 1 | PBNa | 2 | 5 | ⊚ |
| 33 | CDAC | 0.05 | TCT | 1 | m-C4PBNa | 1 | 5 | ⊚ |
| 34 | CDAC | 0.05 | TCT | 1 | m-C8PBNa | 1 | 5 | ⊚ |
| 35 | CDAC | 0.05 | TCT | 1 | 4m-C4PBNa | 1 | 5 | ⊚ |
| 36 | CDAC | 0.05 | TCT | 1 | 4m-C8PBNa | 1 | 5 | ○ |
| 37 | CDAC | 0.05 | TCT | 1 | PBBNa | 1 | 5 | ⊚ |
| 38 | CDAC | 0.05 | TCT | 1 | m-BUPBNa | 1 | 6 | ⊚ |
| 39 | CDAC | 0.05 | TCT | 1 | m-OcPBNa | 1 | 5 | ⊚ |
| 40 | CDAC | 0.05 | TCT | 1 | BPBNa | 1 | 6 | ○ |
| 41 | CDAC | 0.05 | TCT | 1 | NPBNa | 1 | 6 | ○ |
| 42 | CDAC | 0.05 | MDPISb | 1 | FPBNa | 1 | 6 | ⊚ |
| 43 | CDAC | 0.05 | MDPISb | 1 | ClPBK | 1 | 6 | ⊚ |
| 44 | CDAC | 0.05 | MDPISb | 1 | DFPBNa | 1 | 7 | ○ |
| 45 | CDAC | 0.05 | MDPISb | 1 | DMPBNa | 1 | 8 | ⊚ |
| 46 | CDAC | 0.05 | MDPISb | 1 | BFPBNa | 1 | 5 | ⊚ |
| 47 | CDAC | 0.05 | MDPISb | 1 | BDFPBNa | 1 | 5 | ⊚ |
| 48 | CDAC | 0.05 | MDPISb | 1 | BFPBB | 1 | 5 | ⊚ |
| 49 | CDAC | 0.05 | MDPISb | 1 | BFPBP | 1 | 5 | ⊚ |
| 50 | CDAC | 0.05 | MDPISb | 1 | PBNa | 1 | 5 | ⊚ |
| 51 | CDAC | 0.05 | MDPISb | 1 | m-C4PBNa | 1 | 5 | ⊚ |
| 52 | CDAC | 0.05 | MDPISb | 1 | m-C8PBNa | 1 | 5 | ⊚ |
| 53 | CDAC | 0.05 | MDPISb | 1 | 4m-C4PBNa | 1 | 5 | ⊚ |
| 54 | CDAC | 0.05 | MDPISb | 1 | 4m-C8PBNa | 1 | 5 | ○ |
| 55 | CM334 | 0.05 | TCT | 1 | FPBNa | 1 | 6 | ○ |
| 56 | CM6 | 0.05 | TCT | 1 | FPBNa | 1 | 7 | ○ |
| 57 | CM7 | 0.05 | TCT | 1 | FPBNa | 1 | 6 | ○ |
| 58 | TBTC | 0.05 | TCT | 1 | FPBNa | 1 | 8 | ⊚ |
| 59 | CM334 | 0.05 | MDPISb | 1 | FPBNa | 1 | 6 | ○ |
| 60 | CM6 | 0.05 | MDPISb | 1 | FPBNa | 1 | 6 | ○ |
| 61 | CM7 | 0.05 | MDPISb | 1 | FPBNa | 1 | 7 | ○ |
| 62 | TBTC | 0.05 | MDPISb | 1 | FPBNa | 1 | 8 | ○ |
| Comparative Example No. | | | | | | | | |
| 1 | — | — | MDPISb | 1 | FPBNa | 1 | — | XX |
| 2 | CDAC | 0.05 | — | — | FPBNa | 1 | — | XX |
| 3 | CDAC | 0.05 | TCT | 1 | — | — | — | XX |
| 4 | DPYP | 0.05 | TCT | 1 | FPBNa | 1 | — | X |
| 5 | DPYP | 2 | TCT | 1 | FPBNa | 1 | 20 | Δ |
| 6 | DIHIB | 0.05 | TCT | 1 | FPBNa | 1 | — | X |
| 7 | DIHIB | 2 | TCT | 1 | FPBNa | 1 | 23 | Δ |
| 8 | DPENT | 0.05 | TCT | 1 | FPBNa | 1 | 80 | Δ |
| 9 | DPENT | 2 | TCT | 1 | FPBNa | 1 | 18 | ○ |
| 10 | ETTT | 0.05 | TCT | 1 | FPBNa | 1 | 60 | XX |
| 11 | ETTT | 2 | TCT | 1 | FPBNa | 1 | 35 | Δ |
| 12 | CY-1 | 0.05 | TCT | 1 | FPBNa | 1 | 90 | Δ |
| 13 | CY-1 | 2 | TCT | 1 | FPBNa | 1 | 25 | ○ |
| 14 | XA-1 | 0.05 | TCT | 1 | FPBNa | 1 | 120 | Δ |
| 15 | XA-1 | 2 | TCT | 1 | FPBNa | 1 | 19 | ○ |
| 16 | AN-1 | 0.05 | TCT | 1 | FPBNa | 1 | 90 | Δ |
| 17 | AN-1 | 2 | TCT | 1 | FPBNa | 1 | 18 | ○ |
| 18 | SQ-1 | 0.05 | TCT | 1 | FPBNa | 1 | — | XX |
| 19 | SQ-1 | 2 | TCT | 1 | FPBNa | 1 | 20 | Δ |
| 20 | TA-1 | 0.05 | TCT | 1 | FPBNa | 1 | 110 | Δ |
| 21 | TA-1 | 2 | TCT | 1 | FPBNa | 1 | 25 | ○ |
| 22 | AC-1 | 0.05 | TCT | 1 | FPBNa | 1 | — | XX |
| 23 | AC-1 | 2 | TCT | 1 | FPBNa | 1 | 21 | ○ |
| 24 | PY-1 | 0.05 | TCT | 1 | FPBNa | 1 | 160 | Δ |
| 25 | PY-1 | 2 | TCT | 1 | FPBNa | 1 | 23 | ○ |
| 26 | CDAC | 0.05 | TPS-1 | 1 | FPBNa | 1 | — | XX |
| 27 | CDAC | 0.05 | SE-2 | 1 | FPBNa | 1 | — | XX |

TABLE 1-continued

| | Dye | | Photo acid generator | | Aryl borate | | Curability | |
|---|---|---|---|---|---|---|---|---|
| | kind | parts by wt. | kind | parts by wt. | kind | parts by wt. | Gelation time (sec.) | and surface stickiness |
| 28 | CDAC | 0.05 | NAT | 1 | FPBNa | 1 | — | XX |
| 29 | CDAC | 0.05 | conc. HCl | 1 | FPBNa | 1 | 120 | Δ |
| 30 | CDAC | 0.05 | n-phosphoric acid | 1 | FPBNa | 1 | 150 | Δ |

Example 63

As the acidic group-containing (meth)acrylate monomer, MTS (50 parts by weight) was mixed with 3G (20 parts by weight) and HEMA (30 parts by weight) to obtain a homogeneous solution thereof. Then, 0.05 parts by weight of CDAC, 1 part by weight of TCT and 1 part by weight of FPBNa were dissolved per 100 parts by weight of the whole polymerizable monomer composition to obtain a visible-ray polymerizable composition. The composition was used as a tooth adhesive and was measured for its adhesion strength to the tooth. The adhesion strength was as large as 15.2 Mpa to the dentin and 14.8 Mpa to the enamel respectively.

Examples 64 to 116

The adhesion to the enamel and to the dentin was tested in the same manner as in Example 63 but changing the polymerizable monomer composition and the visible-ray polymerization initiator composition as shown in Table 2 and by adding, as required, water and/or fluoroaluminosilicate glass (powdery component in "TOKUSO IONOMER", trade name of Tokuyama Co., hereinafter abbreviated as FASG). The measured results were as shown in Table 2.

Comparative Examples 31 to 36

The procedure was carried out in the same manner as in Example 63 but using known visible-ray polymerization initiators shown in Table 2.

In all of these cases, the adhesion strengths were smaller than those of Examples.

TABLE 2

| Example No. | Acidic group-containing (meth)acrylate | | (Meth)acrylate | | Water (Pts. by wt.) | FASG (Pts. by wt.) | Visible-ray initiator | | | | | | Adhesion strength to dentin (Mpa) | Adhesion strength to enamel (Mpa) |
|---|---|---|---|---|---|---|---|---|---|---|---|---|---|---|
| | monomer | (pts. by wt.) | monomer | (pts. by Wt.) | | | dye | (pts. by wt.) | Photo acid generator | (pts. by wt.) | Aryl borate | (pts. by wt.) | | |
| 64 | MTS | 30 | HEMA | 30 | — | — | CDAC | 0.05 | TCT | 1.0 | FPBNa | 1.0 | 11.5 | 11.0 |
| | POH | 20 | 3G | 20 | | | | | | | | | | |
| 65 | MTS | 30 | HEMA | 30 | — | — | CDAC | 0.05 | PDCT | 1.0 | FPBNa | 1.0 | 12.2 | 12.1 |
| | POH | 20 | 3G | 20 | | | | | | | | | | |
| 66 | MTS | 30 | HEMA | 30 | — | — | CDAC | 0.05 | DPIP | 1.0 | FPBNa | 1.0 | 11.6 | 10.3 |
| | POH | 20 | 3G | 20 | | | | | | | | | | |
| 68 | MTS | 30 | HEMA | 30 | — | — | CDAC | 0.05 | MDPISb | 1.0 | FPBNa | 1.0 | 10.8 | 11.5 |
| | POH | 20 | 3G | 20 | | | | | | | | | | |
| 68 | MTS | 30 | HEMA | 30 | — | — | CDAC | 0.05 | TCT | 0.2 | FPBNa | 0.2 | 9.8 | 9.8 |
| | POH | 20 | 3G | 20 | | | | | | | | | | |
| 69 | MTS | 30 | HEMA | 30 | — | — | CDAC | 0.05 | TCT | 1.5 | FPBNa | 1.5 | 11.5 | 10.3 |
| | POH | 20 | 3G | 20 | | | | | | | | | | |
| 70 | MTS | 30 | HEMA | 30 | — | — | CDAC | 0.01 | TCT | 1.0 | FPBNa | 1.0 | 11.2 | 11.1 |
| | POH | 20 | 3G | 20 | | | | | | | | | | |
| 71 | MTS | 30 | HEMA | 30 | — | — | CDAC | 0.01 | TCT | 2.0 | FPBNa | 2.0 | 10.8 | 10.5 |
| | POH | 20 | 3G | 20 | | | | | | | | | | |
| 72 | MTS | 30 | HEMA | 30 | — | — | CDAC | 0.05 | TCT | 1.0 | CIPBK | 1.0 | 11.6 | 10.8 |
| | POH | 20 | 3G | 20 | | | | | | | | | | |
| 73 | MTS | 30 | HEMA | 30 | — | — | CDAC | 0.05 | TCT | 1.0 | BFPBNa | 1.0 | 10.5 | 11.5 |
| | POH | 20 | 3G | 20 | | | | | | | | | | |
| 74 | MTS | 30 | HEMA | 30 | — | — | CDAC | 0.05 | TCT | 1.0 | PBNa | 1.0 | 12.3 | 12.5 |
| | POH | 20 | 3G | 20 | | | | | | | | | | |
| 75 | MTS | 30 | HEMA | 30 | — | — | CDAC | 0.05 | TCT | 1.0 | m-C4PBNa | 1.0 | 11.5 | 12.8 |
| | POH | 20 | 3G | 20 | | | | | | | | | | |
| 76 | MTS | 30 | HEMA | 30 | — | — | CDAC | 0.05 | TCT | 1.0 | m-C8PBNa | 1.0 | 13.1 | 13.1 |
| | POH | 20 | 3G | 20 | | | | | | | | | | |
| 77 | MTS | 30 | HEMA | 30 | — | — | CDAC | 0.05 | TCT | 1.0 | 4m-C4PBNa | 1.0 | 11.0 | 10.5 |
| | POH | 20 | 3G | 20 | | | | | | | | | | |
| 78 | MTS | 30 | HEMA | 30 | — | — | CDAC | 0.05 | TCT | 1.0 | 4m-C8PBNa | 1.0 | 12.0 | 11.8 |
| | POH | 20 | 3G | 20 | | | | | | | | | | |
| 79 | MTS | 30 | HEMA | 30 | — | — | DPYP | 2.00 | TCT | 1.0 | FPBNa | 1.0 | 10.8 | 12.0 |
| | POH | 20 | 3G | 20 | | | | | | | | | | |

TABLE 2-continued

| Example No. | Acidic group-containing (meth)acrylate monomer | (pts. by wt.) | (Meth)acrylate monomer | (pts. by Wt.) | Water (Pts. by wt.) | FASG (Pts. by wt.) | Visible-ray initiator dye | (pts. by wt.) | Photo acid generator | (pts. by wt.) | Aryl borate | (pts. by wt.) | Adhesion strength to dentin (Mpa) | Adhesion strength to enamel (Mpa) |
|---|---|---|---|---|---|---|---|---|---|---|---|---|---|---|
| 80 | MTS POH | 30 20 | HEMA 3G | 30 20 | — | — | DIHIB | 2.00 | TCT | 1.0 | FPBNa | 1.0 | 11.2 | 10.3 |
| 81 | MTS POH | 30 20 | HEMA 3G | 30 20 | — | — | DPENT | 2.00 | TCT | 1.0 | FPBNa | 1.0 | 12.3 | 11.5 |
| 82 | MTS POH | 30 20 | HEMA 3G | 30 20 | — | — | ETTT | 2.00 | TCT | 1.0 | FPBNa | 1.0 | 9.8 | 9.9 |
| 83 | MTS POH | 30 20 | HEMA 3G | 30 20 | — | — | CY-1 | 2.00 | TCT | 1.0 | FPBNa | 1.0 | 10.5 | 10.8 |
| 84 | MTS POH | 30 20 | HEMA 3G | 30 20 | — | — | XA-1 | 2.00 | SE-2 | 1.0 | FPBNa | 1.0 | 11.0 | 10.5 |
| 85 | MTS POH | 30 20 | HEMA 3G | 30 20 | — | — | AN-1 | 2.00 | TPS-1 | 1.0 | FPBNa | 1.0 | 10.9 | 11.6 |
| 86 | MTS POH | 30 20 | HEMA 3G | 30 20 | — | — | SQ-1 | 2.00 | DPS-1 | 1.0 | FPBNa | 1.0 | 11.1 | 12.1 |
| 87 | MTS POH | 30 20 | HEMA 3G | 30 20 | — | — | TA-1 | 2.00 | DAS-1 | 1.0 | FPBNa | 1.0 | 10.5 | 11.5 |
| 88 | MTS POH | 30 20 | HEMA 3G | 30 20 | — | — | AC-1 | 2.00 | SE-1 | 1.0 | FPBNa | 1.0 | 11.3 | 11.1 |
| 89 | MTS POH | 30 20 | HEMA 3G | 30 20 | — | — | PY-1 | 2.00 | NAT | 1.0 | FPBNa | 1.0 | 11.4 | 11.3 |
| 90 | MTS POH | 30 20 | HEMA 3G | 30 20 | — | — | CM6 | 0.05 | TCT | 1.0 | FPBNa | 1.0 | 12.2 | 10.5 |
| 91 | MTS POH | 30 20 | HEMA 3G | 30 20 | — | — | CM7 | 0.05 | TCT | 1.0 | FPBNa | 1.0 | 12.4 | 11.7 |
| 92 | MTS POH | 30 20 | HEMA 3G | 30 20 | — | — | CM334 | 0.05 | TCT | 1.0 | FPBNa | 1.0 | 11.5 | 10.0 |
| 93 | MTS POH | 30 20 | HEMA 3G | 30 20 | — | — | TBTC | 0.05 | TCT | 1.0 | FPBNa | 1.0 | 10.9 | 12.0 |
| 94 | MTS POH | 30 20 | HEMA Bis-GMA | 30 20 | — | — | CDAC | 0.05 | TCT | 1.0 | FPBNa | 1.0 | 11.2 | 12.3 |
| 95 | MTS POH | 30 20 | HEMA Bis-GMA | 30 20 | — | — | CDAC | 0.05 | MDPISb | 1.0 | FPBNa | 1.0 | 11.0 | 10.2 |
| 96 | MTS MAC-10 | 30 20 | Bis-GMA 3G | 30 20 | — | — | CDAC | 0.05 | TCT | 1.0 | FPBNa | 1.0 | 8.8 | 10.8 |
| 97 | MTS MAC-10 | 30 20 | Bis-GMA 3G | 30 20 | — | — | CDAC | 0.05 | MDPISb | 1.0 | FPBNa | 1.0 | 9.6 | 11.5 |
| 98 | MTS MAC-10 | 30 20 | Bis-GMA 3G | 30 20 | — | — | CDAC | 0.01 | MDPISb | 1.0 | FPBNa | 2.0 | 8.3 | 12.1 |
| 99 | MTS MAC-10 | 30 20 | Bis-GMA 3G | 30 20 | — | — | CM6 | 0.05 | TCT | 1.0 | FPBNa | 1.0 | 9.2 | 10.8 |
| 100 | MTS MAC-10 | 30 20 | Bis-GMA 3G | 30 20 | — | — | CM7 | 0.05 | TCT | 1.0 | FPBNa | 1.0 | 8.9 | 9.8 |
| 101 | MTS POH | 30 20 | Bis-GMA 3G | 30 20 | — | — | CM7 | 0.05 | TCT | 1.0 | FPBNa | 1.0 | 10.0 | 10.1 |
| 102 | MTS POH | 30 20 | Bis-GMA 3G | 30 20 | — | — | CM7 | 0.05 | MDPISb | 1.0 | FPBNa | 1.0 | 9.1 | 9.5 |
| 103 | MTS MAC-10 | 30 20 | Bis-GMA HEMA | 30 20 | — | — | CM7 | 0.05 | TCT | 1.0 | FPBNa | 1.0 | 10.8 | 11.0 |
| 104 | POH MAC-10 | 30 20 | Bis-GMA HEMA | 30 20 | — | — | CM7 | 0.05 | MDPISb | 1.0 | FPBNa | 1.0 | 9.8 | 12.0 |
| 105 | MTS POH | 30 20 | HEMA 3G | 30 20 | 10 | — | CDAC | 0.01 | TCT | 1.0 | PhBNa | 1.0 | 14.1 | 17.5 |
| 106 | MTS POH | 30 20 | HEMA 3G | 30 20 | 15 | — | CDAC | 0.01 | TCT | 1.0 | PhBNa | 1.0 | 13.5 | 18.9 |
| 107 | POH MAC-10 | 30 20 | Bis-GMA HEMA | 30 20 | 10 | — | CDAC | 0.01 | TCT | 1.0 | PhBNa | 1.0 | 12.8 | 18.6 |
| 108 | POH MAC-10 | 30 20 | Bis-GMA HEMA | 30 20 | 15 | — | CDAC | 0.01 | TCT | 1.0 | PhBNa | 1.0 | 13.3 | 17.8 |
| 109 | MTS POH | 30 20 | HEMA 3G | 30 20 | — | 5 | CDAC | 0.01 | TCT | 1.0 | FPBNa | 1.0 | 14.3 | 15.1 |
| 110 | MTS POH | 30 20 | HEMA 3G | 30 20 | — | 10 | CDAC | 0.01 | TCT | 1.0 | FPBNa | 1.0 | 13.9 | 14.9 |
| 111 | POH MAC-10 | 30 20 | Bis-GMA HEMA | 30 20 | — | 5 | CDAC | 0.01 | TCT | 1.0 | FPBNa | 1.0 | 14.3 | 16.8 |
| 112 | POH MAC-10 | 30 20 | Bis-GMA HEMA | 30 20 | — | 10 | CDAC | 0.01 | TCT | 1.0 | FPBNa | 1.0 | 15.6 | 16.2 |
| 113 | MTS POH | 30 20 | HEMA 3G | 30 20 | 10 | 10 | CDAC | 0.01 | TCT | 1.0 | PBNa | 1.0 | 16.4 | 20.0 |
| 114 | MTS POH | 30 20 | HEMA 3G | 30 20 | 15 | 10 | CDAC | 0.01 | TCT | 1.0 | PBNa | 1.0 | 15.8 | 19.9 |

TABLE 2-continued

| Example No. | Acidic group-containing (meth)acrylate monomer | (pts. by wt.) | (Meth)acrylate monomer | (pts. by Wt.) | Water (Pts. by wt.) | FASG (Pts. by wt.) | Visible-ray initiator dye | (pts. by wt.) | Photo acid generator | (pts. by wt.) | Aryl borate | (pts. by wt.) | Adhesion strength to dentin (Mpa) | Adhesion strength to enamel (Mpa) |
|---|---|---|---|---|---|---|---|---|---|---|---|---|---|---|
| 115 | POH | 30 | Bis-GMA | 30 | 10 | 10 | CDAC | 0.01 | TCT | 1.0 | PBNa | 1.0 | 16.4 | 21.3 |
|  | MAC-10 | 20 | HEMA | 20 |  |  |  |  |  |  |  |  |  |  |
| 116 | POH | 30 | Bis-GMA | 30 | 15 | 10 | CDAC | 0.01 | TCT | 1.0 | PBNa | 1.0 | 16.8 | 20.5 |
|  | MAC-10 | 20 | HEMA | 20 |  |  |  |  |  |  |  |  |  |  |
| Co. Ex. 31 | MTS | 30 | HEMA | 30 | — | — |  |  | CQ | 1.0 |  |  | 6.8 | 6.5 |
|  | POH | 20 | 3G | 20 |  |  |  |  | DMBE | 1.0 |  |  |  |  |
| Co. Ex. 32 | MTS | 30 | HEMA | 30 | — | — |  |  | TPO | 1.0 |  |  | 5.5 | 5.8 |
|  | POH | 20 | 3G | 20 |  |  |  |  |  |  |  |  |  |  |
| Co. Ex. 33 | MTS | 30 | HEMA | 30 | — | — |  |  | BDTPO | 1.0 |  |  | 7.5 | 6.9 |
|  | POH | 20 | 3G | 20 |  |  |  |  |  |  |  |  |  |  |
| Co. Ex. 34 | MTS | 30 | HEMA | 30 | 15 | 10 |  |  | CQ | 1.0 |  |  | 8.7 | 10.2 |
|  | POH | 20 | 3G | 20 |  |  |  |  | DMBE | 1.0 |  |  |  |  |
| Co. Ex. 35 | MTS | 30 | HEMA | 30 | 15 | 10 |  |  | TPO | 1.0 |  |  | 7.9 | 10.2 |
|  | POH | 20 | 3G | 20 |  |  |  |  |  |  |  |  |  |  |
| Co. Ex. 36 | MTS | 30 | HEMA | 30 | 15 | 10 |  |  | BDTPO | 1.0 |  |  | 9.1 | 8.5 |
|  | POH | 20 | 3G | 20 |  |  |  |  |  |  |  |  |  |  |

Co. Ex.: Comparative Example

What is claimed is:

1. A visible-ray polymerization initiator comprising:
(A) a coumarin dye;
(B) at least one photo acid generator selected from the group consisting of a halo-alkyl substituted -s-triazine derivative and a diphenyliodonium salt compound; and
(C) a tetraphenyl borate compound.

2. A visible-ray polymerization initiator according to claim 1, wherein said initiator comprises (A) 0.00005 to 30% by weight of the coumarin dye, (B) 0.05 to 80% by weight of the photo acid generator, and (C) 0.05 to 90% by weight of the tetaphehyl borate compound based on the total weight of the above three components.

3. A visible-ray polymerization initiator according to claim 1, wherein the coumarin dye (A) is represented by the following formula (1),

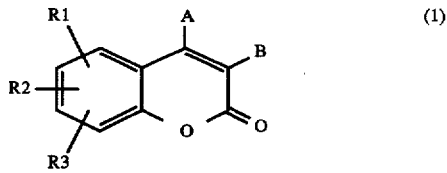 (1)

wherein R1, R2 and R3 are each independently selected from a hydrogen atom, a halogen atom, an alkyl group, an alkoxy group, a substituted or unsubstituted amino group, a substituted or unsubstituted alkylamino group, and a substituted or unsubstituted alkenylamino group, at least two of the three groups R1, R2 and R3 may be bonded together to form a fused ring, A is a hydrogen atom, a cyano group, or a substituted or unsubstituted alkyl group, and B is a hydrogen atom, a heterocyclic group having 5 to 9 carbon atoms, a substituted or unsubstituted aryl group, or a group represented by the following formula,

wherein Z is a substituted or unsubstituted alkyl group, a substituted or unsubstituted aryl group, a substituted or unsubstituted alkenyl group, or a substituted or unsubstituted 3'-coumarino group.

4. A visible-ray polymerization initiator according to claim 1, wherein the photo acid generator (B) is a halo-alkyl substituted -s-triazine derivative represented by the following formula (2),

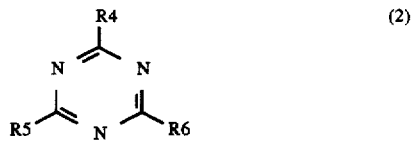 (2)

wherein R4, R5 and R6 are each independently selected from a substituted or unsubstituted alkyl group, a substituted or unsubstituted aryl group, a substituted or unsubstituted alkenyl group, and a substituted or unsubstituted alkoxy group provided that at least one of R4, R5 and R6 is a halo-alkyl group.

5. A visible-ray polymerization initiator according to claim 1, wherein the photo acid generator (B) is a diphenyliodonium salt compound represented by the following formula (3),

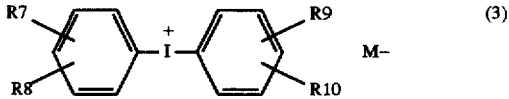 (3)

wherein R7, R8, R9 and R10 are each independently selected from a hydrogen atom, a halogen atom, an alkyl group, an aryl group, an aralkyl group, an alkenyl group and an alkoxy group, and M− is a hydrohalogenic acid ion or a Lewis acid ion.

6. A visible-ray polymerization initiator according to claim 1, wherein the tetraphenyl borate compound (C) is represented by the following formula (4),

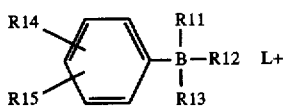

wherein R11, R12 and R13 are a substituted or unsubstituted tetraphenyl group, R14 and R15 are each independently selected from a hydrogen atom, a halogen atom, a substituted or unsubstituted alkyl group, a substituted or unsubstituted alkoxy group, a substituted or unsubstituted phenyl group, and a nitro group, and L+ is a metal ion or an organic base ion.

7. A visible-ray polymerizable composition comprising:

(1) a monomer comprising a (meth)acrylate monomer; and (2) a visible-ray polymerization initiator comprising:
(A) a coumarin dye;
(B) at least one photo acid generator selected from the group consisting of a halo-alkyl substituted -s-triazine derivative and a diphenyliodonium salt compound; and
(C) a tetraphenyl borate compound.

8. A visible-ray polymerizable composition according to claim 7, wherein the visible-ray polymerizable composition comprises 0.01 to 10 parts by weight of the photo polymerization initiator per 100 parts by weight of the total monomer.

9. A visible-ray polymerizable composition according to claim 7, wherein the monomer comprises not less than 5 parts by weight of an acidic group-containing (meth)acrylate monomer per 100 parts by weight of the total monomer.

10. A visible-ray polymerizable composition according to claim 7, wherein the visible-ray polymerizable composition further comprises 2 to 30 parts by weight of water per 100 parts by weight of the total monomer.

11. A visible-ray polymerizable composition according to claim 7, wherein the visible-ray polymerizable composition further comprises 3 to 30 parts by weight of a cation-deliverable filler per 100 parts by weight of the total monomer.

12. A visible-ray polymerization initiator comprising:

(A) an effective 0.00005 to 30% by weight amount of a coumarin dye represented by the following formula (1),

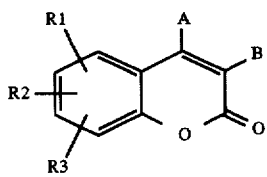

wherein R1, R2 and R3 are each independently selected from a hydrogen atom, a halogen atom, an alkyl group, an alkoxy group, a substituted or unsubstituted amino group, a substituted or unsubstituted alkylamine group, and a substituted or unsubstituted alkenylamino group, at least two of the three groups R1, R2 and R3 may be bonded together to form a fused ring, A is a hydrogen atom, a cyano group, or a substituted or unsubstituted alkly group, and B is a hydrogen atom, a heterodyclic group having 5 to 9 carbon atoms, a substituted or unsubstituted aryl group, or a group represented by the following formula,

wherein Z is a substituted or unsubstituted alkyl group, a substituted or unsubstituted aryl group, a substituted or unsubstituted alkenyl group, or a substituted or unsubstituted 3'-coumarin group;

(B) an effective 0.05 to 80% by weight amount of at least one photo acid generator selected from the group consisting of a halo-alkyl substituted -s-triazine derivative and a diphenyliodonium salt compound; and (C) an effective 0.05 to 90% by weight amount of a tetraphenyl borate compound represented by the following formula (4):

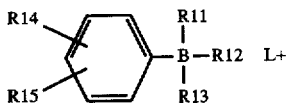

wherein R11, R12 and R13 are substituted or unsubstituted phenyl group, R14 and R15 are each independently selected from a hydrogen atom, a halogen atom, a substituted or unsubstituted alkyl group, a substituted or unsubstituted alkoxy group, a substituted or unsubstituted phenyl group, and a nitro group, and $L^+$ is a metal ion or an organic base ion, wherein the % by weight of the components (A), (B) and (C) is based on the total weight of the three components.

13. A visible-ray polymerization initiator according to claim 12, wherein the photo acid generator (B) is a halo-alkyl substituted -s-triazine derivative represented by the following formula (2).

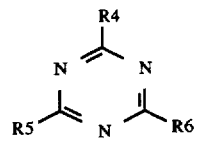

wherein R4, R5 and R6 are each independently selected from a substituted or unsubstituted alkyl group, a substituted alkyl group, a substituted or unsubstituted aryl group, a substituted or unsubstituted alkenyl group, and a substituted or unsubstituted alkoxy group provided that at least one of R4, R5 and R6 is a halo-alkyl group.

14. A visible-ray polymerization initiator according to claim 12, wherein the photo acid generator (B) is a diphenyliodonium salt compound represented by the following formula (3),

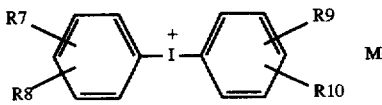

wherein R7, R8, R9 and R10 are each independently selected from a hydrogen atom, a halogen atom, an alkyl group, an aryl group, an aralkyl group, an alkenyl group and an alkoxy group, and M− is a hydrohalogenic acid ion or a Lewis acid ion.

* * * * *